United States Patent
Hughes et al.

(10) Patent No.: US 9,187,692 B2
(45) Date of Patent: Nov. 17, 2015

(54) NANO-CRYSTALLINE CORE AND NANO-CRYSTALLINE SHELL PAIRING HAVING GROUP I-III-VI MATERIAL NANO-CRYSTALLINE CORE

(71) Applicants: Steven M. Hughes, Walla Walla, WA (US); Juanita N. Kurtin, Hillsboro, OR (US)

(72) Inventors: Steven M. Hughes, Walla Walla, WA (US); Juanita N. Kurtin, Hillsboro, OR (US)

(73) Assignee: Pacific Light Technologies Corp., Portland, OR (US)

( * ) Notice: Subject to any disclaimer, the term of this patent is extended or adjusted under 35 U.S.C. 154(b) by 7 days.

(21) Appl. No.: 13/795,752

(22) Filed: Mar. 12, 2013

(65) Prior Publication Data

US 2015/0240153 A1    Aug. 27, 2015

(51) Int. Cl.
*H01L 33/06* (2010.01)
*C09K 11/62* (2006.01)
*C09K 11/88* (2006.01)

(52) U.S. Cl.
CPC .............. *C09K 11/621* (2013.01); *C09K 11/881* (2013.01)

(58) Field of Classification Search
CPC .... H01L 33/06; H01L 33/005; C09K 11/621; C09K 11/881
USPC .......................................................... 257/13
See application file for complete search history.

(56) References Cited

U.S. PATENT DOCUMENTS

| 2007/0207398 | A1* | 9/2007 | Ono et al. | 430/107.1 |
| 2011/0012087 | A1* | 1/2011 | Allen et al. | 257/13 |
| 2014/0166973 | A1* | 6/2014 | Kurtin et al. | 257/13 |

OTHER PUBLICATIONS

Liang, et al., "Highly Luminescent $CuInS_2$/ZnS Core/Shell Nanocrystals: Cadmium-Free Quantum Dots for In Vivo Imaging," Chem. Mater. (2009), vol. 21, Issue: 12, pp. 2422-2429.

* cited by examiner

*Primary Examiner* — Tran Tran
(74) *Attorney, Agent, or Firm* — Blakely Sokoloff Taylor & Zafman LLP

(57) ABSTRACT

Nano-crystalline core and nano-crystalline shell pairings having group I-III-VI material nano-crystalline cores, and methods of fabricating nano-crystalline core and nano-crystalline shell pairings having group I-III-VI material nano-crystalline cores, are described. In an example, a semiconductor structure includes a nano-crystalline core composed of a group I-III-VI semiconductor material. A nano-crystalline shell composed of a second, different, semiconductor material at least partially surrounds the nano-crystalline core. In one specific example, the nano-crystalline core/nano-crystalline shell pairing has a photoluminescence quantum yield (PLQY) of greater than 60%. In another specific example, the nano-crystalline core/nano-crystalline shell pairing is a Type I hetero-structure.

44 Claims, 16 Drawing Sheets

NANO-CRYSTALLINE CORE AND NANO-CRYSTALLINE SHELL PAIRING HAVING GROUP I-III-VI MATERIAL NANO-CRYSTALLINE CORE

TECHNICAL FIELD

Embodiments of the present invention are in the field of quantum dots and, in particular, nano-crystalline core and nano-crystalline shell pairings having group I-III-VI material nano-crystalline cores.

BACKGROUND

Quantum dots having a high photoluminescence quantum yield (PLQY) may be applicable as down-converting materials in down-converting nano-composites used in solid state lighting applications. Down-converting materials are used to improve the performance, efficiency and color choice in lighting applications, particularly light emitting diodes (LEDs). In such applications, quantum dots absorb light of a particular first (available or selected) wavelength, usually blue, and then emit light at a second wavelength, usually red or green.

SUMMARY

Embodiments of the present invention include nano-crystalline core and nano-crystalline shell pairings having group I-III-VI material nano-crystalline cores and methods of fabricating nano-crystalline core and nano-crystalline shell pairings having group I-III-VI material nano-crystalline cores.

In an embodiment, a semiconductor structure includes a nano-crystalline core composed of a group I-III-VI semiconductor material. A nano-crystalline shell composed of a second, different, semiconductor material at least partially surrounds the nano-crystalline core. The nano-crystalline core/nano-crystalline shell pairing has a photoluminescence quantum yield (PLQY) of greater than 60%.

In another embodiment, a semiconductor structure includes a nano-crystalline core composed of a group I-III-VI semiconductor material. A nano-crystalline shell composed of a second, different, semiconductor material at least partially surrounds the nano-crystalline core. The nano-crystalline core/nano-crystalline shell pairing is a Type I heterostructure.

In another embodiment, a composite includes a matrix material and a plurality of semiconductor structures embedded in the matrix material. Each semiconductor structure includes a nano-crystalline core composed of a group I-III-VI semiconductor material and a nano-crystalline shell composed of a second, different, semiconductor material at least partially surrounding the nano-crystalline core. The nano-crystalline core/nano-crystalline shell pairing has a photoluminescence quantum yield (PLQY) of greater than 60%. Each semiconductor structure further includes an amorphous insulator coating surrounding and encapsulating the nano-crystalline core/nano-crystalline shell pairing.

In another embodiment, a composite includes a matrix material and a plurality of semiconductor structures embedded in the matrix material. Each semiconductor structure includes a nano-crystalline core composed of a group I-III-VI semiconductor material and a nano-crystalline shell composed of a second, different, semiconductor material at least partially surrounding the nano-crystalline core. The nano-crystalline core/nano-crystalline shell pairing is a Type I heterostructure. Each semiconductor structure further includes an amorphous insulator coating surrounding and encapsulating the nano-crystalline core/nano-crystalline shell pairing.

DETAILED DESCRIPTION

Nano-crystalline core and nano-crystalline shell pairings having group I-III-VI material nano-crystalline cores, and methods of fabricating nano-crystalline core and nano-crystalline shell pairings having group I-III-VI material nano-crystalline cores, are described herein. In the following description, numerous specific details are set forth, such as specific quantum dot geometries and efficiencies, in order to provide a thorough understanding of embodiments of the present invention. It will be apparent to one skilled in the art that embodiments of the present invention may be practiced without these specific details. In other instances, well-known related apparatuses, such as the host of varieties of applicable light emitting diodes (LEDs) and apparatuses containing LEDs, are not described in detail in order to not unnecessarily obscure embodiments of the present invention. Furthermore, it is to be understood that the various embodiments shown in the figures are illustrative representations and are not necessarily drawn to scale.

One or more embodiments described herein are directed to improvements for quantum dot (QD) performance by fabrication of semiconductor hetero-structures having nano-crystalline cores composed of group I-III-VI materials. Applications of such semiconductor hetero-structures can include uses in light emitting diode (LED) applications, photovoltaics, sensing, photonics, and biotechnology, as examples. One or more embodiments are directed to the fabrication of cadmium (Cd)-free quantum dots (QDs).

To provide context, one or more embodiments is directed to a system of Cd-free materials which serve as high efficiency downconverting quantum dot materials for applications which benefit from the high conversion efficiency of quantum dots, but which cannot tolerate Cd-containing materials. In particular, the materials can serve as downconverters for lighting applications, where the material acts in place of, or together with, a convention phosphor to convert high energy light to lower energy light, and the combination of colors appears white to the observer. Past Cd-free work has focused on copper indium sulfide (CIS) or copper indium gallium sulfide (CIGS) emitter systems in combination with a protective ZnS shell. Some specific embodiments described herein instead focus on the use of Ag-based materials, particularly the I-III-VI systems $AgGaS_2$ and $AgGaSe_2$. These materials have the advantage that they can be tuned not just by size, but also by the stoichiometry of the material. As written, these materials have bandgaps which are suitable for the shell material in a core/shell QD system. However, the inventors have found that lower energy emission can be obtained by varying the stoichiometry of the material system. Therefore, in an embodiment, such materials are suitable both as core and shell materials, in combination with either other I-III-VI materials or with II-VI materials.

Figure 1:
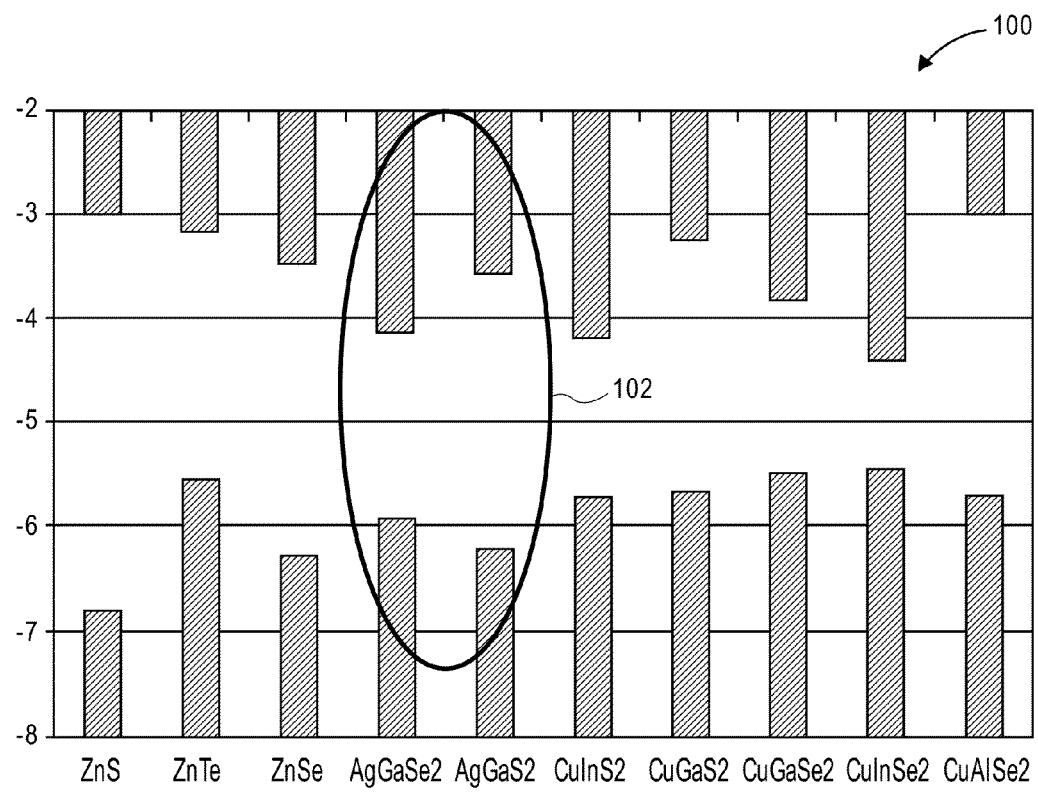
FIG. 1 is a plot of bandgaps of group II-VI and group I-III-VI direct gap semiconductors, plotted relative to the vacuum level, in accordance with an embodiment of the present invention.

FIG. 1 is a plot 100 of bandgaps of group II-VI and group I-III-VI direct gap semiconductors, plotted relative to the vacuum level, in accordance with an embodiment of the present invention. Region 102 of plot 100 includes direct band gaps for $AgGaS_2$ and $AgGaSe_2$ group I-III-VI materials. For the purposes of high performance (high photoluminescent quantum yield and high stability) a typical quantum dot system is composed of a core material overcoated epitaxially with a shell material. For the purposes of very high luminescent quantum yield, the core bandgap should be contained (nested) within the shell bandgap. This configuration electronically shields the excited state from surface traps while promoting overlap between the electron and hole, which increases the probability for radiative emission from the excited state. Nesting of the bandgap of the core material inside the bandgap of the shell material is known as a "Type 1" electronic structure.

Quantum dots based on II-VI semiconductors have historically been the most widely studied, and the synthetic process to control emission placement and quantum efficiency is very well understood. However, studies of non-Cd based systems have commenced and PLQYs between 30% and 80% have been published, primarily driven by the need in solar and biological applications for Cd-free materials. In choosing a Cd-free system of materials for solid state lighting (SSL) applications which mimics the benefits of Cd-based systems already demonstrated, however, the criteria are somewhat different.

In a first aspect, in an embodiment, a core emitter material is selected or designed to have a direct gap semiconductor with a bulk bandgap ideally in the 1-2 eV range. This factor is considered since direct gap semiconductors have the appropriate quantum efficiencies and exciton lifetimes, and because the emission of the QD can only shift blue from the bulk value when tuning by size of the emitter material. As a comparison, cadmium selenide (CdSe) has a somewhat ideal bandgap of 1.74 eV (712 nanometers) which allows tuning of the quantum dot (QD) emission across the visible spectrum. However, some materials such as the I-III-VI materials described herein are susceptible to emission tuning both by size and stoichiometry of the material.

In a second aspect, in an embodiment, an appropriate core/shell pairing is selected or designed to provide a Type I system, promoting radiative recombination in the core (emitter material). Additionally, a Type 1 pairing can allow for absorption and emission to be tuned separately. However, the bulk value of the shell bandgap should not be so far into the UV that the blue excitation light is not well-absorbed.

Figure 2:
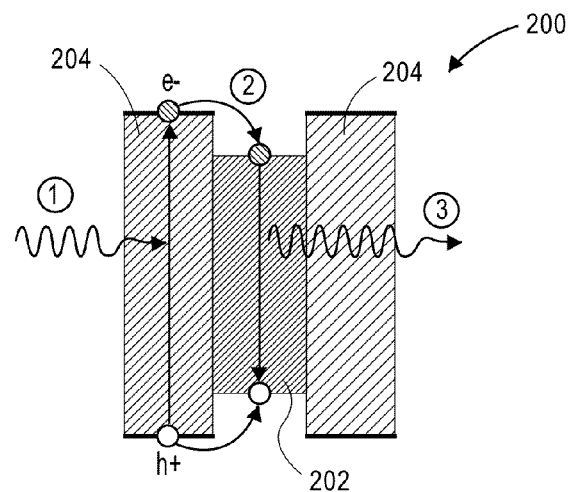
FIG. 2 is a schematic illustrating a Type I core/shell heterostructure and principal of operation, in accordance with an embodiment of the present invention.

FIG. 2 is a schematic 200 illustrating a Type I core 202/shell 204 hetero-structure and principal of operation, in accordance with an embodiment of the present invention. At stage 1, absorption of a high-energy photon by the shell 204 material and generation of an electron ($e^-$)-hole ($h^+$) pair occurs. At stage 2, relaxation into a lower-energy core state occurs. At stage 3, emission via radiative recombination of the electron-hole pair in the core 202 material occurs. It is to be understood that emission from the core 202 travels through the shell material 204, as depicted in FIG. 2.

In a third aspect, in an embodiment, a relatively small lattice mismatch between the core and shell is used. As a Cd-based example, CdSe and CdS have an approximately 4% lattice mismatch. Such small mismatch allows for a very thick and/or asymmetric shell to be grown on the core, and also allows tuning of the relative absorption of the core and shell. It may be preferable to grow a very large shell so that the shell is the dominant absorber, and the core is the dominant emitter.

In a fourth aspect, in an embodiment, core/shell pairings are selected or designed to provide an inherently stable system for temperatures up to approximately 200 degrees Celsius, or at least to provide suitability for integration into an LED-based luminaire. For example, QDs which are doped can have a broad emission line width likely due to the variations in the position of the dopant atoms, rendering them a poor candidate for a red phosphor replacement material. Additionally, dopants can easily be "annealed" out from the core of the QD to the surface, making them much more susceptible to non-radiative recombination.

To address and accommodate one or more of the above aspects, one or more embodiments described herein involve fabrication of a semiconductor hetero-structure. The semiconductor hetero-structure has a nano-crystalline core composed of a group I-III-VI semiconductor material. A nano-crystalline shell composed of a second, different, semiconductor material at least partially surrounds the nano-crystalline core. For example, the nano-crystalline shell may be composed of a different group I-III-VI semiconductor material or of a group II-VI semiconductor material.

In one such embodiment, the above described nano-crystalline core/nano-crystalline shell pairing has a photoluminescence quantum yield (PLQY) of greater than approximately 60%. In another, or same, such embodiment, the nano-crystalline core/nano-crystalline shell pairing provides a Type I hetero-structure. By contrast, a report by Li et al, Chem. Mater. 2009, v. 21, no. 12, pgs 2422-2429 referred to a Type I hetero-structure with a CuInS core. However, the system of Li et al. showed emission data based on bulk emission measurements. It is the present inventors' contention that the seemingly low PLQY reported therein suggests a fully alloyed structure without a distinct group I-III-VI material core. As such, one or more embodiments described herein are directed to hetero-structure systems having distinct group I-III-VI material cores.

Figure 3:
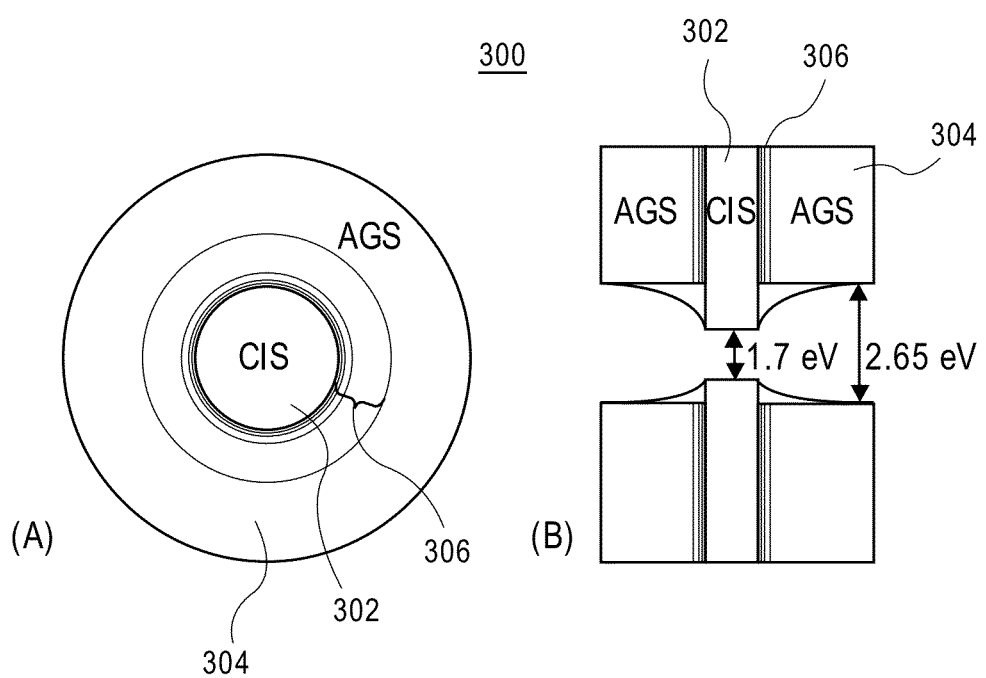
FIG. 3 illustrates an axial cross-sectional view (A) and an electronic structure diagram (B) of a graded copper indium sulfide (CIS)/AgGaS$_2$ (AGS) nano-particle, in accordance with an embodiment of the present invention.

In an exemplary embodiment, a sphere or rod-shaped core/shell quantum dot is fabricated to have a sharp compositional interface between the core and shell or a graded/alloyed interface between core and shell. FIG. 3 illustrates an axial cross-sectional view (A) of a graded copper indium sulfide (CIS)/AgGaS$_2$ (AGS) nano-particle 300, in accordance with an embodiment of the present invention. Referring to FIG. 3, an alloy region 306 is included between the core 302 and shell 304 of 300. As shown in part (B) of FIG. 3, in one embodiment, the nano-particle 300 demonstrates type I hetero-structure behavior, with excitons preferentially recombining in the core 302 of the nano-crystal 300 due to the smaller, nested bandgap of CIS (approximately 1.7 eV) versus AGS (approximately 2.65 eV). Optionally, additional layers of material may be added, including additional epitaxial layers or amorphous inorganic and organic layers. Other suitable embodiments are described below.

In an embodiment, systems described herein include a nano-crystalline core emitter having a direct, bulk band gap approximately in the range of 1-2.5 eV. Exemplary cores include a group I-III-VI semiconductor material based on silver gallium sulfide having a stoichiometry of approximately AgGaS$_2$. In one such embodiment, the nano-crystalline core has a peak emission approximately in the range of 475-575 nanometers.

Figure 4:
FIG. 4 is a plot of lattice constants (in Angstroms) of group I-III-VI and II-VI materials plotted along both X- and Y-axes, with the diagonal line representing same materials (0% mismatch), in accordance with an embodiment of the present invention.

In one or more embodiments, the nano-crystalline core and nano-crystalline shell pairings described herein have a lattice mismatch of equal to or less than approximately 10%. In some embodiments, less than approximately 6% mismatch is preferable, but up to approximately 10% can be workable. In particular embodiments, the mismatch is less than approximately 4% mismatch, as seen in successful Cd-based systems. FIG. 4 is a plot 400 of lattice constants (in Angstroms) of group I-III-VI and II-VI materials plotted along both X- and Y-axes, with the diagonal line representing same materials (0% mismatch), in accordance with an embodiment of the present invention. Referring to FIG. 4, lattice mismatches for corresponding material combinations are provided. The lattice mismatch values can be used to determine suitable combinations of core/shell materials for high performance hetero-structure quantum dot fabrication.

As mentioned briefly above, one or more embodiments described herein is directed to a hetero-structure core/shell pairing that is cadmium-free. For example, with reference to the above described nano-crystalline core and nano-crystalline shell pairings, in an embodiment, the first (core) material is a group I-III-VI semiconductor material. In one such embodiment, the second (shell) semiconductor material is a second group I-III-VI material. For example, a suitable I-III-VI/I-III-VI core/shell pairing can include, but is not limited to, copper indium sulfide (CIS)/silver gallium sulfide (AgGaS$_2$), copper indium selenide (CISe)/AgGaS$_2$, copper gallium selenide (CuGaSe$_2$)/copper gallium sulfide (CuGaS$_2$), or CuGaSe$_2$/AgGaS$_2$. In another such embodiment, the second (shell) semiconductor material is a group II-VI material. For example, a suitable I-III-VI/II-VI core/shell pairing can include, but is not limited to, copper indium sulfide (CIS)/zinc selenide (ZnSe), CIS/zinc sulfide (ZnS), copper indium selenide (CISe)/ZnSe, CISe/ZnS, copper gallium selenide (CuGaSe$_2$)/ZnSe, CuGaSe$_2$/ZnS, silver gallium sulfide (AgGaS$_2$)/ZnS, AgGaS$_2$/ZnSe, or silver gallium selenide (AgGaSe$_2$)/ZnS, AgGaSe$_2$/ZnSe.

In an embodiment, the semiconductor hetero-structure further includes a nano-crystalline outer shell composed of a third semiconductor material different from the core and shell semiconductor materials. The third semiconductor material at least partially surrounding the nano-crystalline shell and, in one embodiment, the nano-crystalline outer shell completely surrounds the nano-crystalline shell. In a particular embodiment, the second (shell) semiconductor material one such as, but not limited to, zinc selenide (ZnSe), silver gallium sulfide (AgGaS$_2$) or copper gallium sulfide (CuGaS$_2$), and the third (outer shell) semiconductor material is zinc sulfide (ZnS).

Thus, embodiments described herein are directed to nano-particles based on semiconductor hetero-structures having nano-crystalline cores composed of group I-III-VI materials, such as hetero-structure-based quantum dots. Such hetero-structures may have specific geometries suitable for performance optimization, e.g., for high performance quantum dot behavior. In an example, several factors may be intertwined for establishing an optimized geometry for a quantum dot having a nano-crystalline core and nano-crystalline shell pairing. As a reference, FIG. 5 illustrates a schematic of a cross-sectional view of a quantum dot, in accordance with an embodiment of the present invention.

Figure 5:
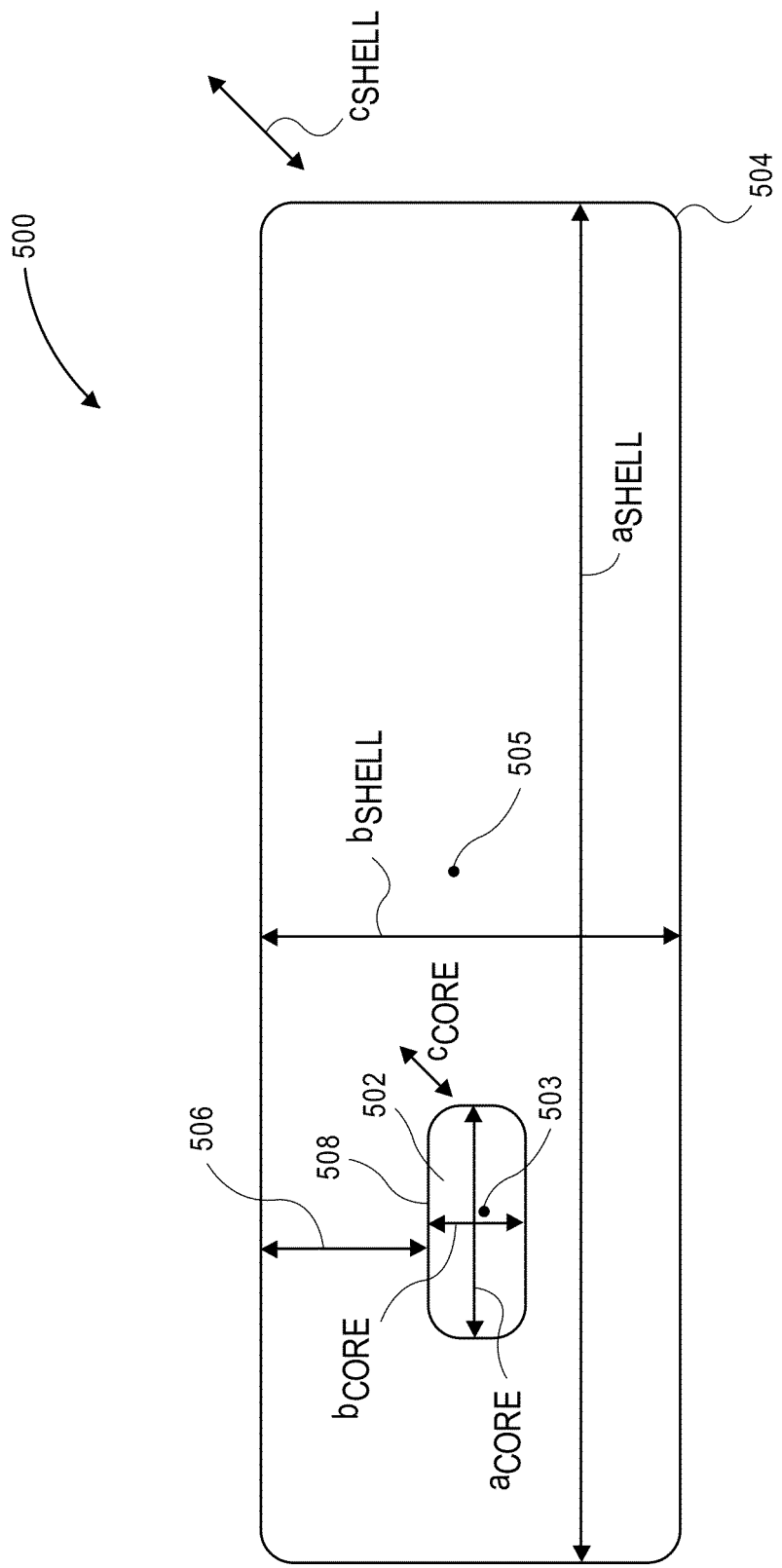
FIG. 5 illustrates a schematic of a cross-sectional view of a quantum dot, in accordance with an embodiment of the present invention.

Referring to FIG. 5, a semiconductor structure (e.g., a quantum dot structure) 500 includes a nano-crystalline core 502 surrounded by a nano-crystalline shell 504. The nano-crystalline core 502 has a length axis ($a_{CORE}$), a width axis ($b_{CORE}$) and a depth axis ($c_{CORE}$), the depth axis provided into and out of the plane shown in FIG. 5. Likewise, the nano-crystalline shell 504 has a length axis ($a_{SHELL}$), width axis ($b_{SHELL}$) and a depth axis ($c_{SHELL}$), the depth axis provided into and out of the plane shown in FIG. 5. The nano-crystalline core 502 has a center 503 and the nano-crystalline shell 504 has a center 505. The nano-crystalline shell 504 surrounds the nano-crystalline core 502 in the b-axis direction by an amount 506, as is also depicted in FIG. 5.

The following are attributes of a quantum dot that may be tuned for optimization, with reference to the parameters provided in FIG. 5, in accordance with embodiments of the present invention. Nano-crystalline core 502 diameter (a, b or c) and aspect ratio (e.g., a/b) can be controlled for rough tuning for emission wavelength (a higher value for either providing increasingly red emission). A smaller overall nano-crystalline core provides a greater surface to volume ratio. The width of the nano-crystalline shell along 506 may be tuned for yield optimization and quantum confinement providing approaches to control red-shifting and mitigation of surface effects. However, strain considerations must be accounted for when optimizing the value of thickness 506. The length ($a_{SHELL}$) of the shell is tunable to provide longer radiative decay times as well as increased light absorption. The overall aspect ratio of the structure 500 (e.g., the greater of $a_{SHELL}/b_{SHELL}$ and $a_{SHELL}/c_{SHELL}$) may be tuned to directly impact PLQY. Meanwhile, overall surface/volume ratio for 500 may be kept relatively smaller to provide lower surface defects, provide higher photoluminescence, and limit self-absorption. Referring again to FIG. 5, the shell/core interface 508 may be tailored to avoid dislocations and strain sites. In one such embodiment, a high quality interface is obtained during nano-particle fabrication by tailoring one or more of precursor injection temperature and mixing parameters, the use of surfactants, and control of the reactivity of precursors.

In accordance with an embodiment of the present invention, a high PLQY quantum dot is based on a core/shell pairing using an anisotropic core. With reference again to FIG. 5, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nano-crystalline core for a quantum dot may be selected for maximization of PLQY. For example, a core that is essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nano-crystalline core composed of a first semiconductor material, e.g., a group I-III-VI material, and having an aspect ratio between, but not including, 1.0 and 2.0. The semiconductor structure also includes a nano-crystalline shell composed of a second, different, semiconductor material at least partially surrounding the anisotropic nano-crystalline core. In one such embodiment, the aspect ratio of the anisotropic nano-crystalline core is approximately in the range of 1.01-1.2 and, in a particular embodiment, is approximately in the range of 1.1-1.2. In the case of rounded edges, then, the anisotropic nano-crystalline core may be substantially, but not perfectly, spherical. However, the nano-crystalline core may instead be faceted. In an embodiment, the anisotropic nano-crystalline core is disposed in an asymmetric orientation with respect to the nano-crystalline shell, as described in greater detail in the example below.

Another consideration for maximization of PLQY in a quantum dot structure is to provide an asymmetric orientation of the core within a surrounding shell. For example, referring again to FIG. 5, the center 503 of the core 502 may be misaligned with (e.g., have a different spatial point than) the center 505 of the shell 504. In an embodiment, a semiconductor structure includes an anisotropic nano-crystalline core composed of a first semiconductor material. The semiconductor structure also includes a nano-crystalline shell composed of a second, different, semiconductor material at least partially surrounding the anisotropic nano-crystalline core. The anisotropic nano-crystalline core is disposed in an asymmetric orientation with respect to the nano-crystalline shell. In one such embodiment, the nano-crystalline shell has a long axis (e.g., $a_{SHELL}$), and the anisotropic nano-crystalline core is disposed off-center along the long axis. In another such embodiment, the nano-crystalline shell has a short axis (e.g., $b_{SHELL}$), and the anisotropic nano-crystalline core is disposed off-center along the short axis. In yet another embodiment, however, the nano-crystalline shell has a long axis (e.g., $a_{SHELL}$) and a short axis (e.g., $b_{SHELL}$), and the anisotropic nano-crystalline core is disposed off-center along both the long and short axes.

With reference to the above described nano-crystalline core and nano-crystalline shell pairings, in an embodiment, the nano-crystalline shell completely surrounds the anisotropic nano-crystalline core. In an alternative embodiment, however, the nano-crystalline shell only partially surrounds the anisotropic nano-crystalline core, exposing a portion of the anisotropic nano-crystalline core, e.g., as in a tetrapod geometry or arrangement. In an embodiment, the nano-crystalline shell is an anisotropic nano-crystalline shell, such as a nano-rod, that surrounds the anisotropic nano-crystalline core at an interface between the anisotropic nano-crystalline shell and the anisotropic nano-crystalline core. The anisotropic nano-crystalline shell passivates or reduces trap states at the interface. The anisotropic nano-crystalline shell may also, or instead, deactivate trap states at the interface.

With reference again to the above described nano-crystalline core and nano-crystalline shell pairings, in an embodiment, the semiconductor structure (i.e., the core/shell pairing in total) has an aspect ratio approximately in the range of 1.5-10 and, 3-6 in a particular embodiment. In an embodiment, the nano-crystalline shell has a long axis and a short axis. The long axis has a length approximately in the range of 5-40 nanometers. The short axis has a length approximately in the range of 1-5 nanometers greater than a diameter of the anisotropic nano-crystalline core parallel with the short axis of the nano-crystalline shell. In a specific such embodiment, the anisotropic nano-crystalline core has a diameter approximately in the range of 2-5 nanometers. The thickness of the nano-crystalline shell on the anisotropic nano-crystalline core along a short axis of the nano-crystalline shell is approximately in the range of 1-5 nanometers of the second semiconductor material.

With reference again to the above described nano-crystalline core and nano-crystalline shell pairings, in an embodiment, the anisotropic nano-crystalline core and the nano-crystalline shell form a quantum dot. In one such embodiment, the quantum dot has a photoluminescence quantum yield (PLQY) of at least 60%. Emission from the quantum dot may be mostly, or entirely, from the nano-crystalline core. For example, in an embodiment, emission from the anisotropic nano-crystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nano-crystalline core and nano-crystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-conversion or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of emission color from the semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color. These structures may also be used to downconvert or upconvert lower energy light (green, yellow, etc) from LED devices, as long as the excitation light produces emission from the structures.

The above described semiconductor hetero-structures, e.g., quantum dots, may be fabricated to further include one or more compositional transition layers between portions of the structures, e.g., between core and shell portions. Inclusion of such a transition layer may reduce or eliminate any performance inefficiency associated with otherwise abrupt junctions between the different portions of the structures. For example, the inclusion of a compositional transition layer may be used to suppress Auger recombination within a quantum dot structure. Auger recombination events translate to energy from one exciton being non-radiatively transferred to another charge carrier. Such recombination in quantum dots typically occurs on sub-nanosecond time scales such that a very short multi-exciton lifetime indicates non-radiative recombination, while higher nanosecond bi-exciton lifetimes indicate radiative recombination. A radiative bi-exciton has a lifetime approximately 2-4 times shorter than radiative single exciton.

More specifically, as is described in greater detail below in association with FIGS. 6-8, an optimal particle (e.g., quantum dot structure) may have one or more of a high aspect ratio, a large volume relative to other quantum dot hetero-structures, and graded or alloyed transitions between different semiconductor materials. The graded or alloyed transitions can be used to render a compositional and structural transition from one component (such as a quantum dot core composed of a group I-III-VI material) to another component (such as a quantum dot shell) a smooth function rather than a step function. In one embodiment, the terms "graded," "gradient," or "grading" are used to convey gradual transitioning from one semiconductor to another. In one embodiment, the terms "alloy," "alloyed," or "alloying" are used to convey an entire volume having a fixed intermediate composition. In more specific embodiments, core or seed volume is maximized relative to shell volume for a given emission color. A graded or alloyed core/shell transition layer may be included between the two volumes.

Figure 6:
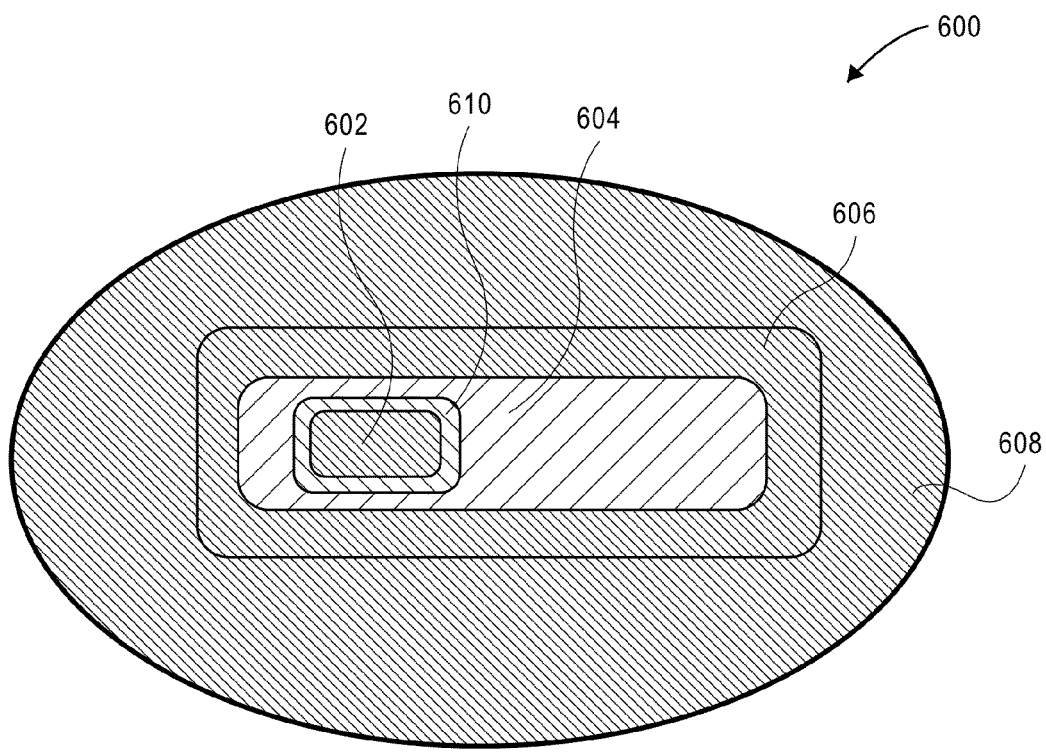
FIG. 6 illustrates a cross-sectional view of a semiconductor structure having a nano-crystalline core and nano-crystalline shell pairing with one compositional transition layer, in accordance with an embodiment of the present invention.

In a first example, FIG. 6 illustrates a cross-sectional view of a semiconductor structure having a nano-crystalline core and nano-crystalline shell pairing with one compositional transition layer, in accordance with an embodiment of the present invention.

Referring to FIG. 6, a semiconductor structure 600 includes a group I-III-VI material (first material) nano-crystalline core 602. A nano-crystalline shell 604 composed of a second, different, semiconductor material at least partially surrounds the nano-crystalline core 602. A compositional transition layer 610 is disposed between, and in contact with, the nano-crystalline core 602 and nano-crystalline shell 604. The compositional transition layer 610 has a composition intermediate to the first and second semiconductor materials.

In an embodiment, the compositional transition layer 610 is an alloyed layer composed of a mixture of the first and second semiconductor materials. In another embodiment, the compositional transition layer 610 is a graded layer composed of a compositional gradient of the first semiconductor material proximate to the nano-crystalline core 602 through to the second semiconductor material proximate to the nano-crystalline shell 604. In either case, in a specific embodiment, the compositional transition layer 610 has a thickness approximately in the range of 1.5-2 monolayers.

In accordance with an embodiment of the present invention, the compositional transition layer 610 passivates or reduces trap states where the nano-crystalline shell 604 surrounds the nano-crystalline core 602. Exemplary embodiments of core and/or shell parameters include a structure 600 where the nano-crystalline core 602 is an anisotropic nano-crystalline core having an aspect ratio between, but not including, 1.0 and 2.0 (in a specific embodiment, approximately in the range of 1.01-1.2), and the nano-crystalline shell is an anisotropic nano-crystalline shell having an aspect ratio approximately in the range of 2-6.

In an embodiment, the nano-crystalline shell 604 completely surrounds the nano-crystalline core 602, as depicted in FIG. 6. In an alternative embodiment, however, the nano-crystalline shell 604 only partially surrounds the nano-crystalline core 602, exposing a portion of the nano-crystalline core 602. Furthermore, in either case, the nano-crystalline core 602 may be disposed in an asymmetric orientation with respect to the nano-crystalline shell 604. In one or more embodiments, semiconductor structures such as 600 are fabricated to further include a nano-crystalline outer shell 606 at least partially surrounding the nano-crystalline shell 604. The nano-crystalline outer shell 606 may be composed of a third semiconductor material different from the first and second semiconductor materials, i.e., different from the materials of the core 602 and shell 604. The nano-crystalline outer shell 606 may completely surround the nano-crystalline shell 604 or may only partially surround the nano-crystalline shell 604, exposing a portion of the nano-crystalline shell 604.

For embodiments including a nano-crystalline outer shell, an additional compositional transition layer may be included. Thus, in a second example, FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Figure 7:
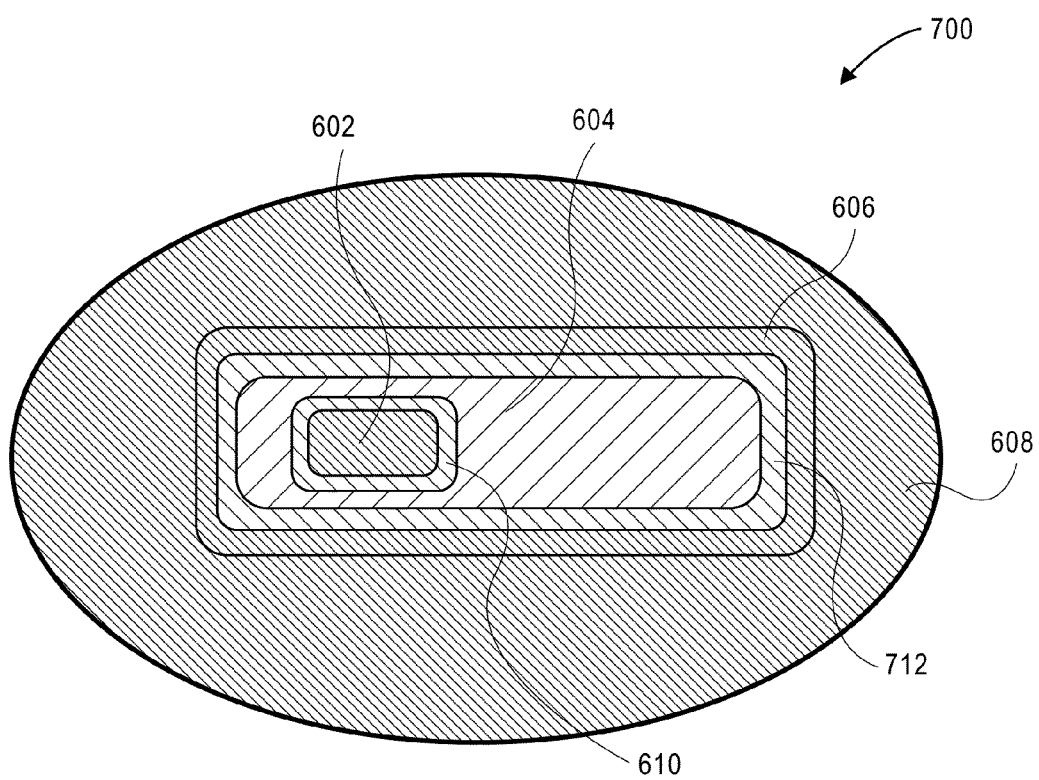
FIG. 7 illustrates a cross-sectional view of a semiconductor structure having a nano-crystalline core/nano-crystalline shell/nano-crystalline outer shell combination with two compositional transition layers, in accordance with an embodiment of the present invention.

Referring to FIG. 7, a semiconductor structure 700 includes the group I-III-VI material nano-crystalline core 602, nano-crystalline shell 604, nano-crystalline outer shell 606 and compositional transition layer 610 of structure 600. However, in addition, semiconductor structure 700 includes a second compositional transition layer 712 disposed between, and in contact with, the nano-crystalline shell 604 and the nano-crystalline outer shell 606. The second compositional transition layer 712 has a composition intermediate to the second and third semiconductor materials, i.e., intermediate to the semiconductor materials of the shell 604 and outer shell 606.

In an embodiment, the second compositional transition layer 712 is an alloyed layer composed of a mixture of the second and third semiconductor materials. In another embodiment, the second compositional transition layer 712 is a graded layer composed of a compositional gradient of the second semiconductor material proximate to the nano-crystalline shell 604 through to the third semiconductor material proximate to the nano-crystalline outer shell 606. In either case, in a specific embodiment, the second compositional transition layer 712 has a thickness approximately in the range of 1.5-2 monolayers. In accordance with an embodiment of the present invention, the second compositional transition layer 712 passivates or reduces trap states where the nano-crystalline outer shell 606 surrounds the nano-crystalline shell 604.

For other embodiments including a nano-crystalline outer shell, an outer compositional transition layer may be included without including an inner compositional transition layer. Thus, in a third example, FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Figure 8:
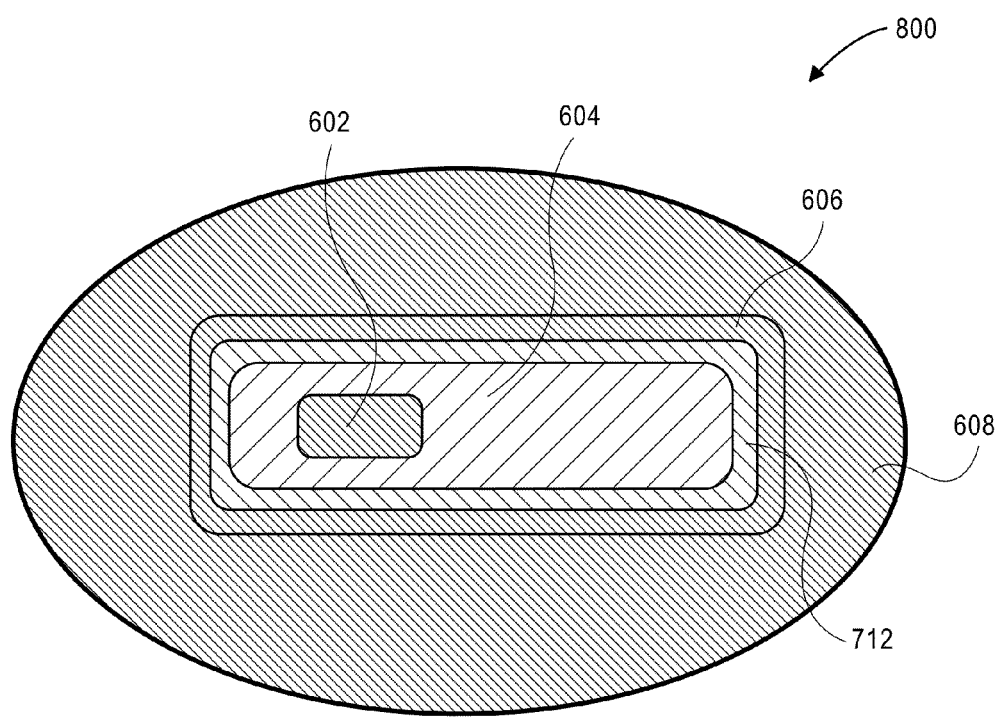
FIG. 8 illustrates a cross-sectional view of a semiconductor structure having a nano-crystalline core/nano-crystalline shell/nano-crystalline outer shell combination with one compositional transition layer, in accordance with an embodiment of the present invention.

Referring to FIG. 8, a semiconductor structure 800 includes the group I-III-VI material nano-crystalline core 602, the nano-crystalline shell 604, and nano-crystalline outer shell 606 of structure 600. In addition, the semiconductor structure 800 includes the compositional transition layer 712 of structure 700 disposed between, and in contact with, the nano-crystalline shell 604 and the nano-crystalline outer shell 606. However, structure 800 does not include the compositional transition layer 610 of structure 600, i.e., there is no compositional transition layer between the core 602 and shell 604.

Referring again to FIGS. 5-8, and as depicted in FIGS. 6-8, the structures 500, 600, 700 and 800 may further include an insulator coating (e.g., shown as 608 in FIGS. 6-8) surrounding and encapsulating the nano-crystalline core/nano-crystalline shell pairing or nano-crystalline core/nano-crystalline shell/nano-crystalline outer shell combination. In one such embodiment, the insulator coating is composed of an amorphous material such as, but not limited to, silica ($SiO_x$), titanium oxide ($TiO_x$), zirconium oxide ($ZrO_x$), alumina ($AlO_x$), or hafnia ($HfO_x$). In an embodiment, insulator-coated structures based on structures 500, 600, 700 and 800 are quantum dot structures. For example, structures 500, 600, 700 and 800 may be used as a down-converting quantum dot or an up-shifting quantum dot.

Figure 9:
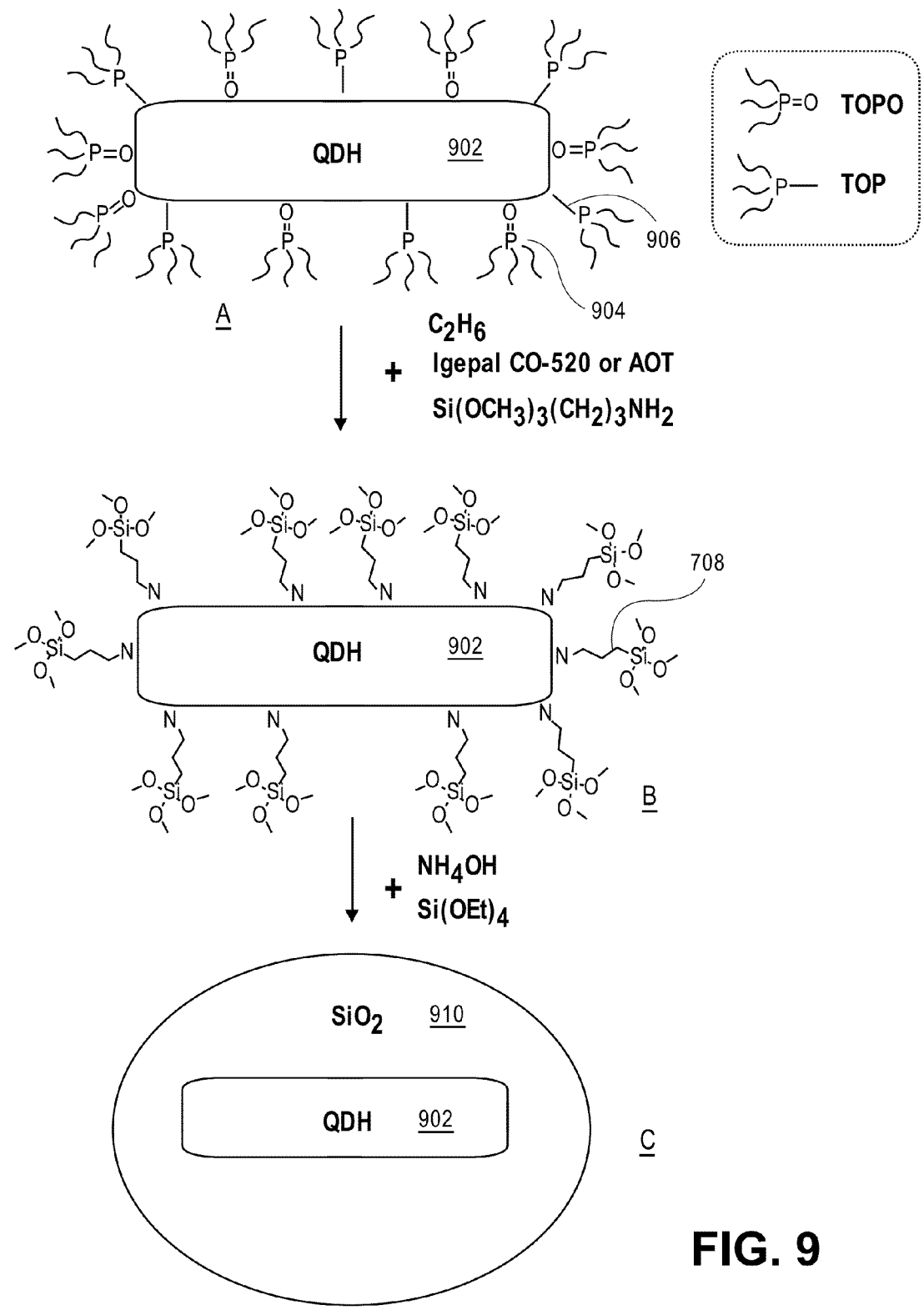
FIG. 9 illustrates operations in a reverse micelle approach to coating a semiconductor structure, in accordance with an embodiment of the present invention.

The above described insulator coating may be formed to encapsulate a quantum dot using a reverse micelle process. For example, FIG. 9 illustrates operations in a reverse micelle approach to coating a semiconductor structure, in accordance with an embodiment of the present invention. Referring to part A of FIG. 9, a quantum dot hetero-structure (QDH) 902 (e.g., a nano-crystalline core/shell pairing) has attached thereto a plurality of TOPO ligands 904 and TOP ligands 906. Referring to part B, the plurality of TOPO ligands 904 and TOP ligands 906 are exchanged with a plurality of $Si(OCH_3)_3(CH_2)_3NH_2$ ligands 908. The structure of part B is then reacted with TEOS ($Si(OEt)_4$) and ammonium hydroxide ($NH_4OH$) to form a silica coating 910 surrounding the QDH 902, as depicted in part C of FIG. 9.

In another aspect, a matrix including semiconductor hetero-structures having nano-crystalline cores composed of group I-III-VI materials is applied to a lighting device to provide a layer having a dispersion of the semiconductor structures therein for inclusion in the lighting device. The matrices can include a dispersion of semiconductor structures such as those described above in association with FIGS. 5-8. In a general embodiment, a composite includes a matrix material. A plurality of semiconductor structures (e.g., quantum dot structures having a coated or non-coated core/shell pairing, such as the structures described above) is embedded in the matrix material. In an embodiment, a lighting apparatus includes a light emitting diode and a composite coating the light emitting diode. The composite may be formed by embedding quantum dots in a matrix material such as the matrix materials described below.

Figure 10A:
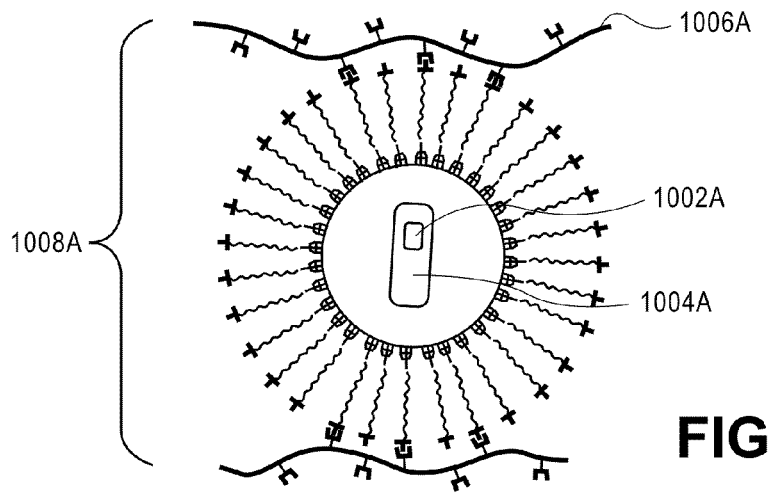
FIGS. 10A-10C illustrate schematic representations of possible composite compositions for quantum dot integration, in accordance with an embodiment of the present invention.
Figure 10B:
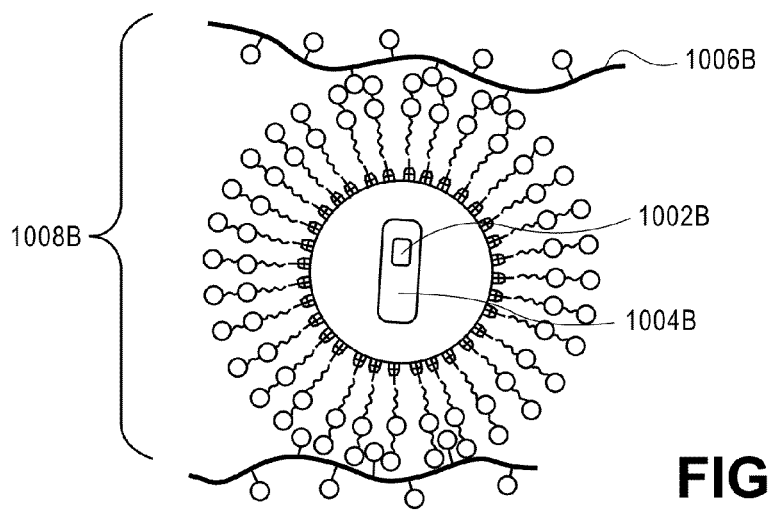
Figure 10C:
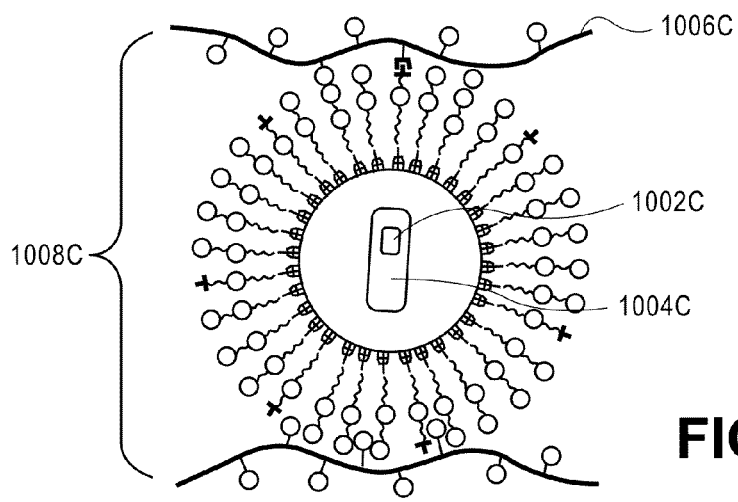

With reference to the above described composite, in an embodiment, each of the plurality of semiconductor structures is cross-linked with, polarity bound by, or tethered to the matrix material. In an embodiment, each of the plurality of semiconductor structures is bound to the matrix material by a covalent, dative, or ionic bond. By way of example, FIGS. 10A-10C illustrate schematic representations of possible composite compositions for quantum dot integration, in accordance with an embodiment of the present invention. Referring to FIG. 10A, a nano-crystalline core 1002A and shell 1004A pairing is incorporated into a polymer matrix 1006A by active cross-linking through multiple and inter-chain binding to form a cross-linked composition 1008A. Referring to FIG. 10B, a nano-crystalline core 1002B and shell 1004B pairing is incorporated into a polymer matrix 1006B by polarity-based chemical similarity and dissolution to form a polarity based composition 1008B. Referring to FIG. 10C, a nano-crystalline core 1002C and shell 1004C pairing is incorporated into a polymer matrix 1006C by reactive tethering by sparse binding and chemical similarity to form a reactive tethering based composition 1008C.

With reference again to the above described composite, in an embodiment, one or more of the semiconductor structures further includes a coupling agent covalently bonded to an outer surface of the insulator layer. For example, in one such embodiment, the insulator layer includes or is a layer of silica ($SiO_x$), and the coupling agent is a silane coupling agent, e.g., having the formula $X_nSiY_{4-n}$, where X is a functional group capable of bonding with the matrix material and is one such as, but not limited to, hydroxyl, alkoxy, isocyanate, carboxyl, epoxy, amine, urea, vinyl, amide, aminoplast and silane, Y is a functional group such as, but not limited to, hydroxyl, phenoxy, alkoxy, hydroxyl ether, silane or aminoplast, and n is 1, 2 or 3. In another embodiment, however, the coupling agent is one such as, but not limited to, a titanate coupling agent or a zirconate coupling agent. It is to be understood that the terms capping agent, capping ligand, ligand and coupling agent may be used interchangeably as described above and, generally, may include an atom, molecule or other chemical entity or moiety attached to or capable of being attached to a nano-particle. Attachment may be by dative bonding, covalent bonding, ionic bonding, Van der Waals forces or other force or bond.

In the case that a silica surface of a silica coated quantum dot is modified using silane coupling agents having multiple functional moieties, coupling to the surface of the silica shell and coupling to a matrix material and/or other matrix additives may be enabled. Such an approach provides uniform dispersion throughout the composite matrix using as little effort (e.g., reaction energy) as possible. Stronger physical and/or chemical bonding between the silica coated quantum dots and the matrix resin occurs. Also, the silane coupling composition must be compatible with both the silica coated quantum dot, which is inorganic, and the polymer matrix, which may be organic. Without being bound by any particular theory or principle, it is believed that the silane coupling agent forms a bridge between the silica and the matrix resin when reactive functional groups on the silane coupling agent interact with functional groups on the surface of the silica and/or the matrix resin. Because the functional groups involved are typically polar in nature, the coupling agent tends to be hydrophilic and readily dispersed in an aqueous size composition.

Matrix materials suitable for embodiments of the present invention may satisfy the following criteria: they may be optically clear having transmission in the 400-700 nm range of greater than 90%, as measured in a UV-Vis spectrometer. The matrix material may have a high refractive index between about 1.0 and 2.0, preferably above 1.4 in the 400-700 nm range. The matrix material may also have good adhesion to an LED surface if required and/or are sufficiently rigid for self-supporting applications. And, the matrix material may able to maintain their properties over a large temperature range, for example −40° C. to 150° C. and over a long period of time (over 50,000 hours at a light intensity typically 1-10 w/cm2 of 450 nm blue light).

Thus, with reference again to the above described composite, in an embodiment, the insulator layer is composed of a layer of silica ($SiO_x$), and the matrix material is composed of a siloxane copolymer. In another embodiment, the matrix material has a UV-Vis spectroscopy transmission of greater than 90% for light in the range of 400-700 nanometers. In an embodiment, the matrix material has a refractive index approximately in the range of 1-2 for light in the range of 400-700 nanometers. In an embodiment, the matrix material is thermally stable in a temperature range of −40-250 degrees Celsius. In an embodiment, the matrix material is composed of a polymer such as, but not limited to, polypropylene, polyethylene, polyesters, polyacetals, polyamides, polyacrylamides, polyimides, polyethers, polyvinylethers, polystyrenes, polyoxides, polycarbonates, polysiloxanes, polysulfones, polyanhydrides, polyamines, epoxies, polyacrylics, polyvinylesters, polyurethane, maleic resins, urea resins, melamine resins, phenol resins, furan resins, polymer blends, polymer alloys, or mixtures thereof. In one such embodiment, the matrix material is composed of a polysiloxane such as, but not limited to, polydimethylsiloxane (PDMS), polymethylphenylsiloxane, polydiphenylsiloxane and polydiethylsiloxane. In an embodiment, the matrix material is composed of a siloxane such as, but not limited to, dimethylsiloxane or methylhydrogen siloxane.

Additionally, with reference again to the above described composite, in an embodiment, the plurality of semiconductor structures is embedded homogeneously in the matrix material. In an embodiment, the composite further includes a compounding agent embedded in the matrix material. The compounding agent is one such as, but not limited to, an antioxidant, a pigment, a dye, an antistatic agent, a filler, a flame retardant, an ultra-violet (UV) stabilizer, or an impact modifier. In another embodiment, the composite further includes a catalyst embedded in the matrix material, the catalyst one such as, but not limited to, a thiol catalyst or a platinum (Pt) catalyst.

Accordingly, in an embodiment, a method of fabrication includes forming a plurality of semiconductor hetero-structures embedded in a matrix material (or embedding preformed semiconductor structures in a matrix material). In one such embodiment, embedding the plurality of semiconductor structures in the matrix material includes cross-linking, reactive tethering, or ionic bonding the plurality of semiconductor structures with the matrix material. In an embodiment, the method further includes surface-functionalizing an insulator layer for the semiconductor structures prior to embedding the plurality of semiconductor structures in the matrix material. In one such embodiment, the surface-functionalizing includes treating the insulator layer with a silane coupling agent. However, in an alternative embodiment, coated semiconductor structures are embedded in a matrix by using a ligand-free insulator layer.

In another embodiment, simple substitution at the surface of the silica coated quantum dots is effective for stable integration without undesired additional viscosity and is suitable to produce a low-viscosity product such as a silicone gel. In one embodiment of the present invention a composite incorporates quantum dots which crosslink with the matrix through silane groups and which possess an adequate number of silane groups in order to form an elastic network. In addition, adequate adhesion to various substrates is enabled. Furthermore, silicone-based matrixes may be used. A structure of such polymers may be obtained which form microstructures in the crosslinked composition, thereby yielding cross-linked polymer compounds with an excellent mechanical strength. Furthermore, because of the distribution of the reactive silane groups, a high elasticity may be obtained after cross-linking.

Figure 11:
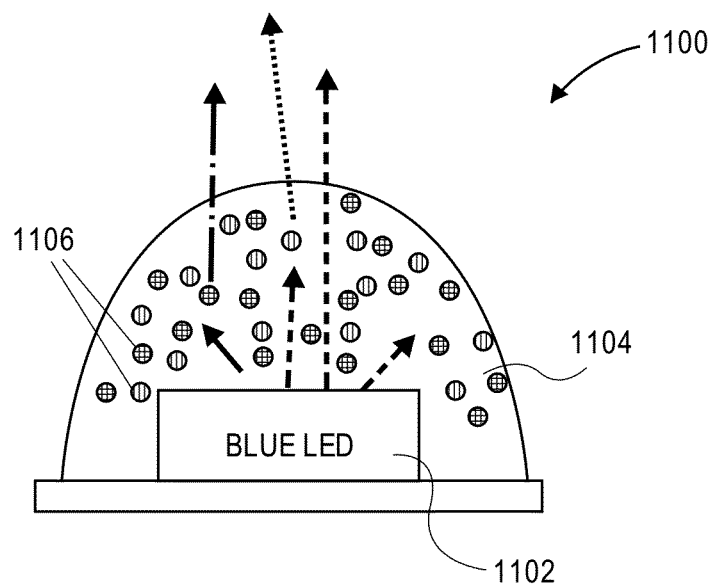
FIG. 11 illustrates a lighting device that includes a blue LED with a layer having a composition with a dispersion of quantum dots therein, in accordance with an embodiment of the present invention.

With respect to illustrating the above concepts in a resulting device configuration, FIG. 11 illustrates a lighting device 1100. Device 1100 has a blue LED 1102 with a layer 1104 having a dispersion of quantum dots 1106 therein, in accordance with an embodiment of the present invention. Devices such as 1100 may be used to produce "cold" or "warm" white light. In one embodiment, the device 1100 has little to no wasted energy since there is little to no emission in the IR regime. In a specific such embodiment, the use of a layer having a composition with a dispersion of quantum dots based on semiconductor hetero-structures having nano-crystalline cores composed of group I-III-VI materials therein enables greater than approximately 40% lm/W gains versus the use of conventional phosphors. Increased efficacy may thus be achieved, meaning increased luminous efficacy based on lumens (perceived light brightness) per watt electrical power. Accordingly, down converter efficiency and spectral overlap may be improved with the use of a dispersion of quantum dots to achieve efficiency gains in lighting and display. In an additional embodiment, a conventional phosphor is also included in the composition, along with the dispersion of quantum dots 1106.

Figure 12:
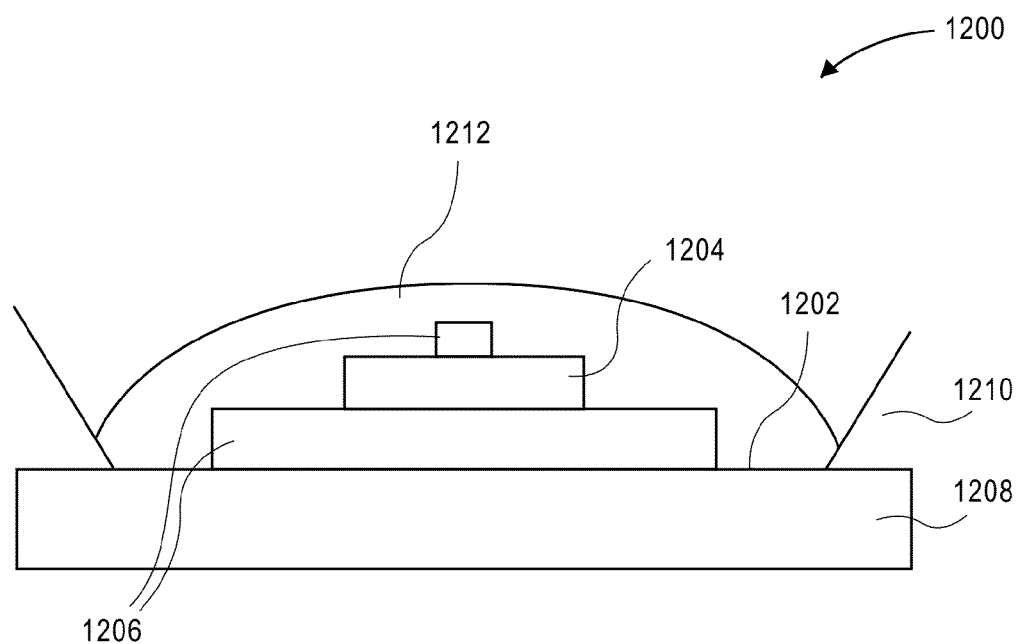
FIG. 12 illustrates a cross-sectional view of a lighting device with a layer having a composition with a dispersion of quantum dots therein, in accordance with an embodiment of the present invention.

Different approaches may be used to provide a quantum dot layer in a lighting device. In an example, FIG. 12 illustrates a cross-sectional view of a lighting device 1200 with a layer having a composition with a dispersion of quantum dots therein, in accordance with an embodiment of the present invention. Referring to FIG. 12, a blue LED structure 1202 includes a die 1204, such as an InGaN die, and electrodes 1206. The blue LED structure 1202 is disposed on a coating or supporting surface 1208 and housed within a protective and/or reflective structure 1210. A layer 1212 is formed over the blue LED structure 1202 and within the protective and/or reflective structure 1210. The layer 1212 has a composition including a dispersion of quantum dots or a combination of a dispersion of quantum dots and conventional phosphors. Although not depicted, the protective and/or reflective structure 1210 can be extended upwards, well above the matrix layer 1212, to provide a "cup" configuration.

Figure 13:
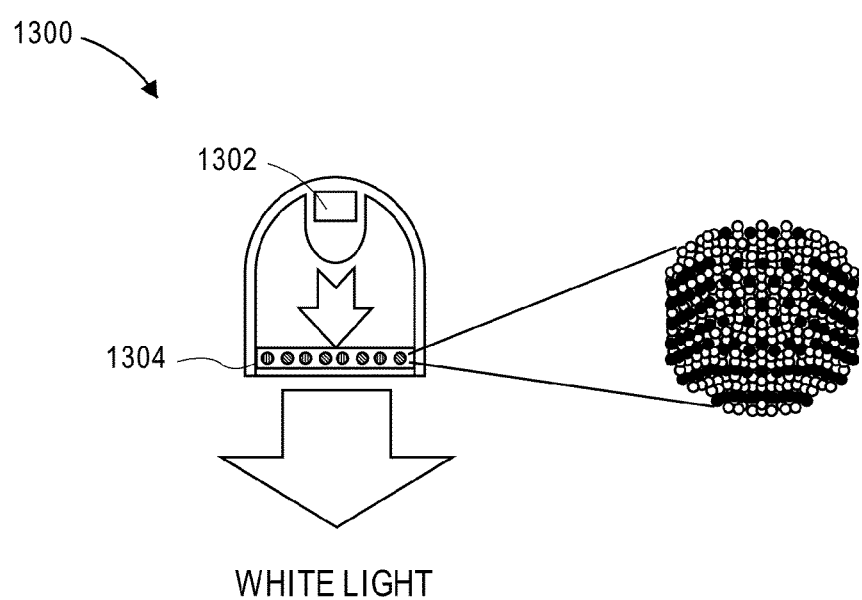
FIG. 13 illustrates a cross-sectional view of a lighting device with a layer having a composition with a dispersion of quantum dots therein, in accordance with another embodiment of the present invention.

In another example, FIG. 13 illustrates a cross-sectional view of a lighting device 1300 with a layer having a composition with a dispersion of quantum dots therein, in accordance with another embodiment of the present invention. Referring to FIG. 13, the lighting device 1300 includes a blue LED structure 1302. A quantum dot down converter screen 1304 is positioned somewhat remotely from the blue LED structure 1302. The quantum dot down converter screen 1304 includes a layer with a composition having a dispersion of quantum dots therein, e.g., of varying color, or a combination of a dispersion of quantum dots and conventional phosphors. In one embodiment, the device 1300 can be used to generate white light, as depicted in FIG. 13.

Figure 14:
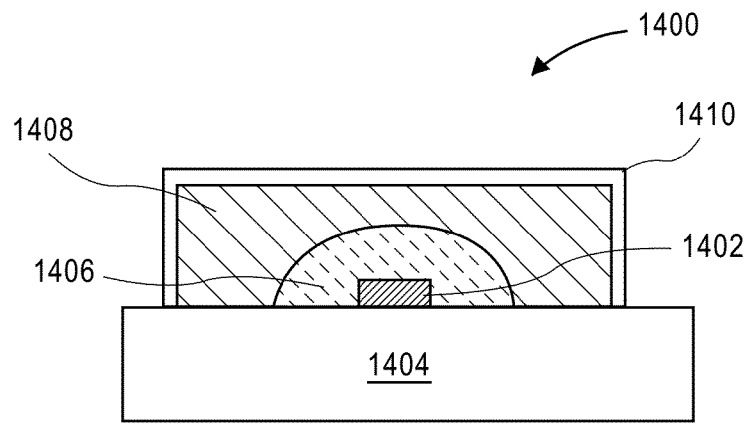
FIG. 14 illustrates a cross-sectional view of a lighting device with a layer having a composition with a dispersion of quantum dots therein, in accordance with another embodiment of the present invention.

In another example, FIG. 14 illustrates a cross-sectional view of a lighting device 1400 with a layer having a composition with a dispersion of quantum dots therein, in accordance with another embodiment of the present invention. Referring to FIG. 14, the lighting device 1400 includes a blue LED structure 1402 supported on a substrate 1404 which may house a portion of the electrical components of the blue LED structure 1402. A first conversion layer 1406 has a composition that includes a dispersion of red-light emitting quantum dots therein. A second conversion layer 1408 has a second composition that includes a dispersion of quantum dots or green or yellow phosphors or a combination thereof (e.g., yttrium aluminum garnet, YAG phosphors) therein. Optionally, a sealing layer 1410 may be formed over the second conversion layer 1408, as depicted in FIG. 14. In one embodiment, the device 1400 can be used to generate white light.

Figure 15:
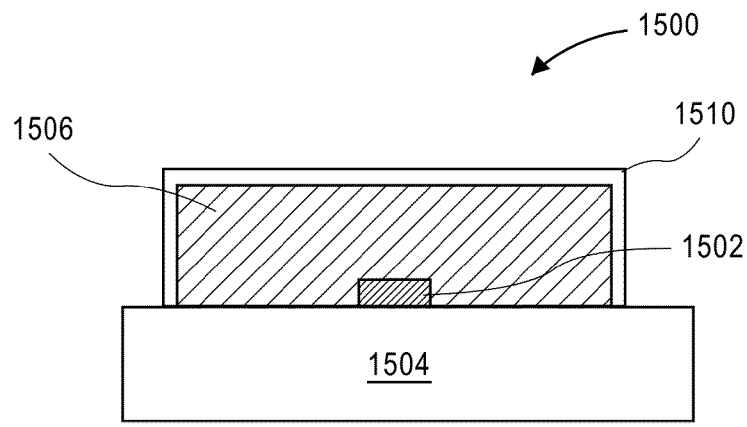
FIG. 15 illustrates a cross-sectional view of a lighting device with a layer having a composition with a dispersion of quantum dots therein, in accordance with another embodiment of the present invention.

In another example, FIG. 15 illustrates a cross-sectional view of a lighting device 1500 with a layer having a composition with a dispersion of quantum dots therein, in accordance with another embodiment of the present invention. Referring to FIG. 15, the lighting device 1500 includes a blue LED structure 1502 supported on a substrate 1504 which may house a portion of the electrical components of the blue LED structure 1502. A single conversion layer 1506 has a composition that includes a dispersion of red-light emitting quantum dots in combination with a dispersion of green quantum dots or green and/or yellow phosphors therein. Optionally, a sealing layer 1510 may be formed over the single conversion layer 1506, as depicted in FIG. 15. In one embodiment, the device 1500 can be used to generate white light.

Figure 16A:
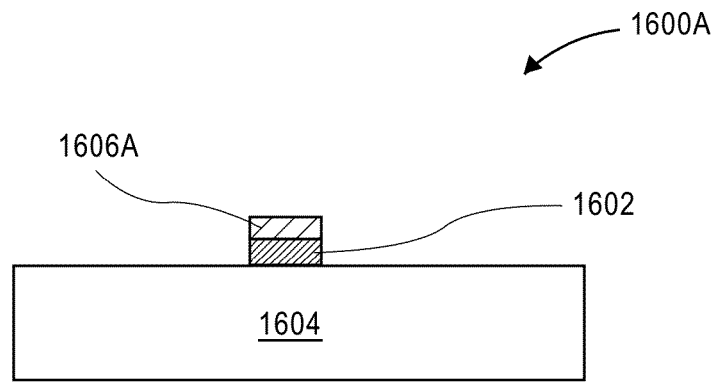
FIGS. 16A-16C illustrate cross-sectional views of various configurations for lighting devices with a layer having a composition with a dispersion of quantum dots therein, in accordance with another embodiment of the present invention.
Figure 16B:
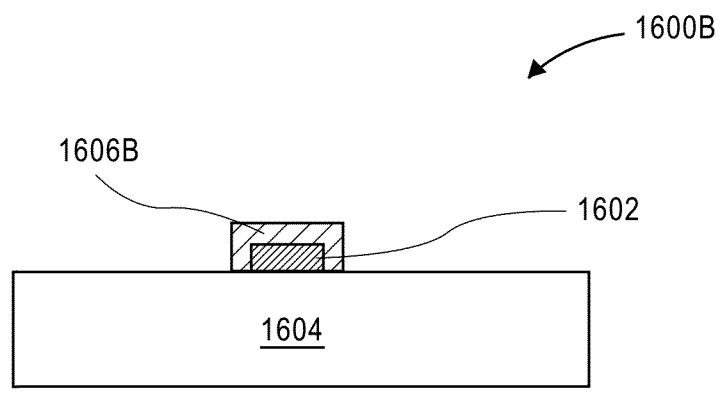
Figure 16C:
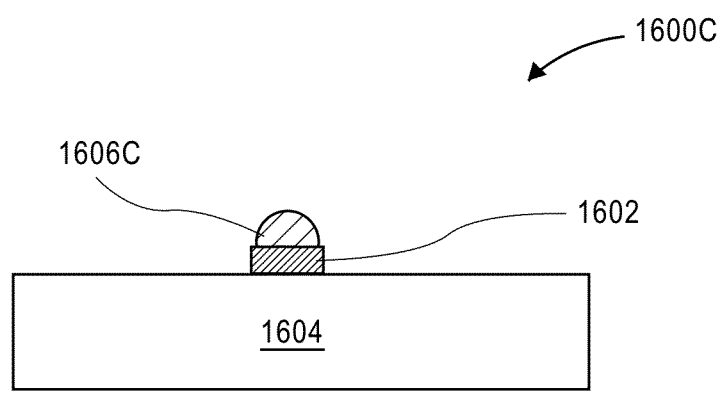

In additional examples, FIGS. 16A-16C illustrate cross-sectional views of various configurations for lighting devices 1600A-1600C with a layer having a composition with a dispersion of quantum dots therein, respectively, in accordance with another embodiment of the present invention. Referring to FIGS. 16A-16C, the lighting devices 1600A-1600C each include a blue LED structure 1602 supported on a substrate 1604 which may house a portion of the electrical components of the blue LED structure 1602. A conversion layer 1606A-1606C, respectively, has a composition that includes a dispersion of one or more light-emitting color types of quantum dots therein. Referring to FIG. 1600A specifically, the conversion layer 1606A is disposed as a thin layer only on the top surface of the blue LED structure 1602. Referring to FIG. 1600B specifically, the conversion layer 1606B is disposed as a thin layer conformal with all exposed surfaces of the blue LED structure 1602. Referring to FIG. 1600C specifically, the conversion layer 1606C is disposed as a "bulb" only on the top surface of the blue LED structure 1602. In the above examples (e.g., FIGS. 11-15 and 16A-16C), although use with a blue LED is emphasized, it is to be understood that a layer having a composition with a dispersion of quantum dots therein can be used with other light sources as well, including LEDs other than blue LEDs.

In another aspect, synthetic approaches are provided for forming group I-III-VI cores for hetero-structure particles, such as quantum dots.

Figure 17:
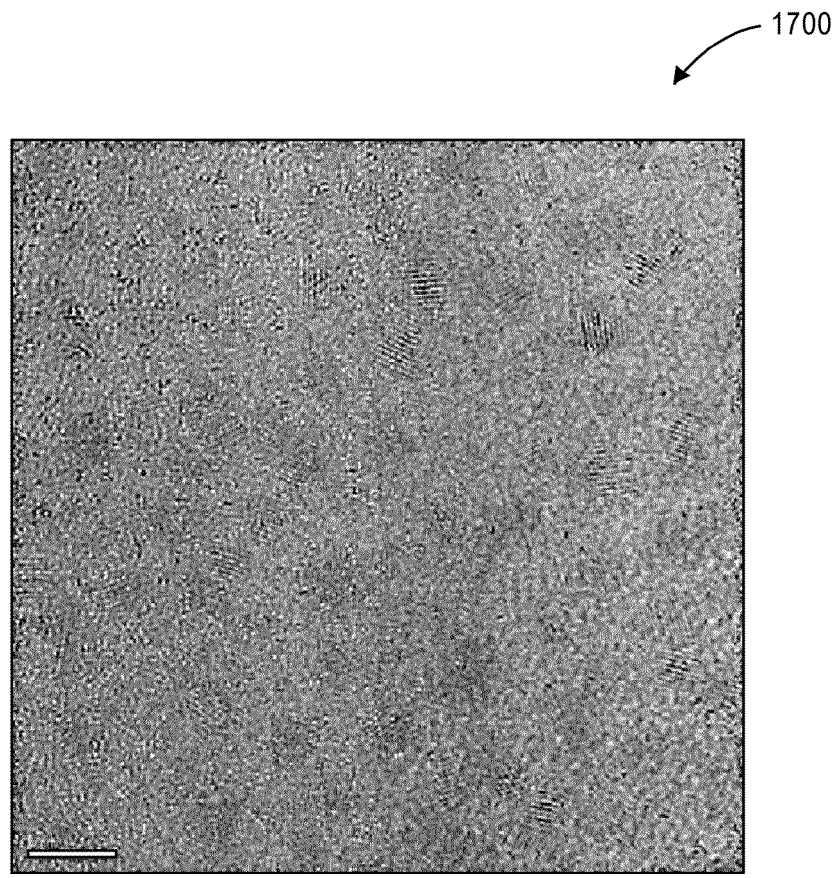
FIG. 17 is a transmission electron microscope image of copper indium sulfide (CIS) nano-particles of approximately 3 nanometers in size, with a scale bar of 5 nanometers, in accordance with an embodiment of the present invention.

In a first example, high quality copper indium sulfide (CIS) particles were grown from a reaction using copper iodide, indium acetate, and in a solvent of dodecanethiol (DDT), which also serves as the sulfur precursor. In this reaction, all components are mixed together at room temperature, degassed, and heated to approximately 230 degrees Celsius. The particles nucleate and grow during this heating process, and it was found that the more rapidly the reaction is heated, the more uniform the crystals appear to grow. FIG. 17 is a transmission electron microscope image 1700 of copper indium sulfide (CIS) nano-particles of approximately 3 nanometers in size, with a scale bar of 5 nanometers, in accordance with an embodiment of the present invention. The CIS nano-particles of image 1700 are suitable for use as emitting cores in hetero-structure based quantum dots.

Figure 18:
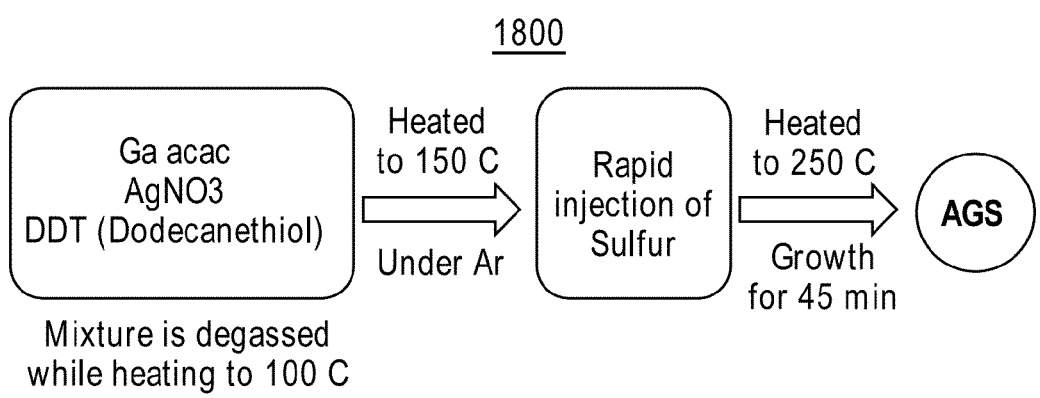
FIG. 18 is a schematic showing a general growth method for silver gallium sulfide (AGS) nano-particles, in accordance with an embodiment of the present invention.

In a second example, for the principle silver gallium sulfide (AGS) synthetic reaction, a system of reagents was chosen for general safe handling and compatibility with the CIS growth parameters. FIG. 18 is a schematic 1800 showing a general growth method for silver gallium sulfide (AGS) nano-particles, in accordance with an embodiment of the present invention. In one embodiment, using a Ag:Ga ratio of 1:2 yielded an emission peak at approximately 550 nanometers, while using a Ag:Ga ratio of 1:4 yielded an emission peak at approximately 500 nanometers.

Thus, referring again to FIG. 18, in an embodiment, a method of fabricating a semiconductor structure involves forming a first solution including a gallium (Ga) source and a silver (Ag) source. The method next involves adding sulfur (S) to the first solution to form a second solution including the Ga source, the Ag source, and the sulfur. The second solution is heated to form a plurality of silver gallium sulfide (AGS) nano-particles, e.g., for use as nano-crystalline cores in a hetero-structure quantum dot particle. In one embodiment, the plurality of AGS nano-particles is formed to have a stoichiometry of approximately $AgGaS_2$.

Referring again to FIG. 18, in one such embodiment, the first solution is formed by dissolving gallium acetylacetonate (ACAC) and silver nitrate ($AgNO_3$) in dodecanethiol (DDT) in the presence of a mixture of carboxylic acid. In a specific such embodiment, the method further involves degassing the first solution while heating the first solution at a temperature of approximately 100 degrees Celsius. In a particular such embodiment, the method further involves, subsequent to the degassing, heating the first solution to a temperature of approximately 150 degrees Celsius under an atmosphere of argon (Ar). In one embodiment, the first solution is formed by using a Ga source to Ag source ratio of at least approximately 1:2.

In another such embodiment, the second solution is formed by rapidly injecting the sulfur into the first solution. In one embodiment, the method further involves heating the second solution to a temperature of approximately 250 degrees Celsius.

Figure 19:
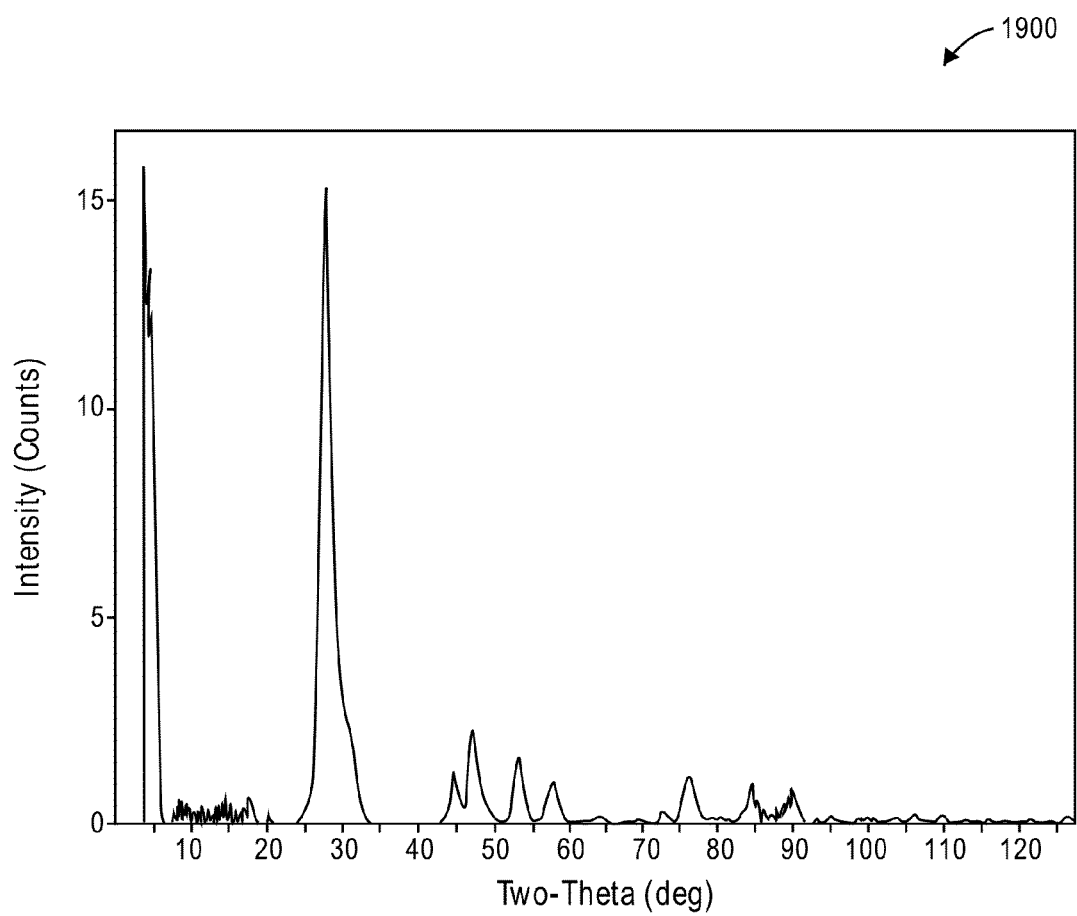
FIG. 19 is an X-ray diffraction (XRD) plot of intensity (counts) as a function of Two-Theta (degrees) for a sample of silver gallium sulfide (AGS) nano-particles fabricated according to methods described herein, in accordance with an embodiment of the present invention.

FIG. 19 is an X-ray diffraction (XRD) plot 1900 of intensity (counts) as a function of Two-Theta (degrees) for a sample of silver gallium sulfide (AGS) nano-particles fabricated according to methods described herein, in accordance with an embodiment of the present invention. Plot 1900 appears to conclusively indicate that a form of AGS is in fact being grown in the chalcopyrite phase.

Figure 20:
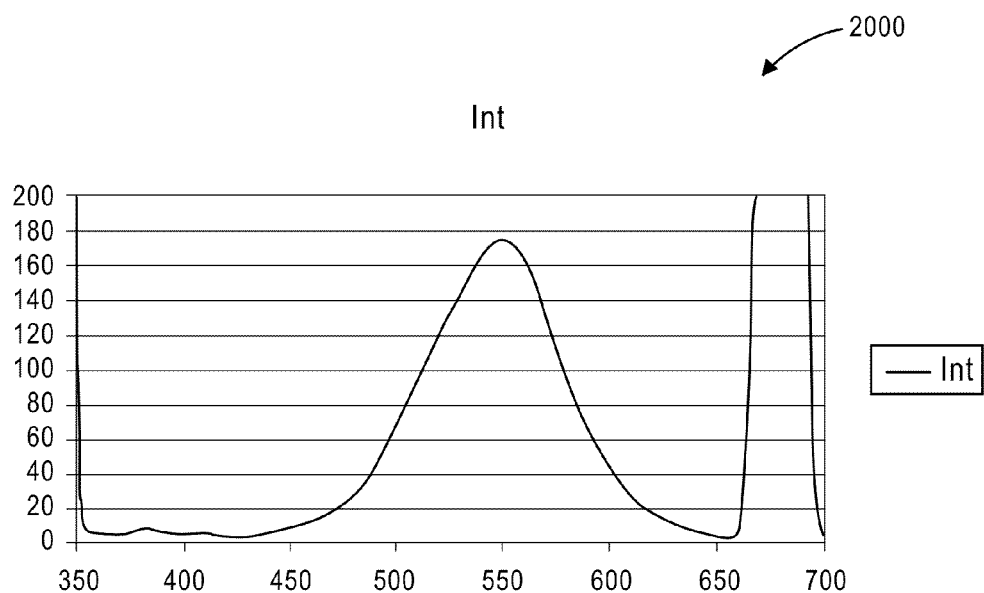
FIG. 20 is a fluorescence spectrum of silver gallium sulfide (AGS) nano-particles grown with a 1:2 Ag:Ga precursor ratio, in accordance with an embodiment of the present invention.
Figure 21:
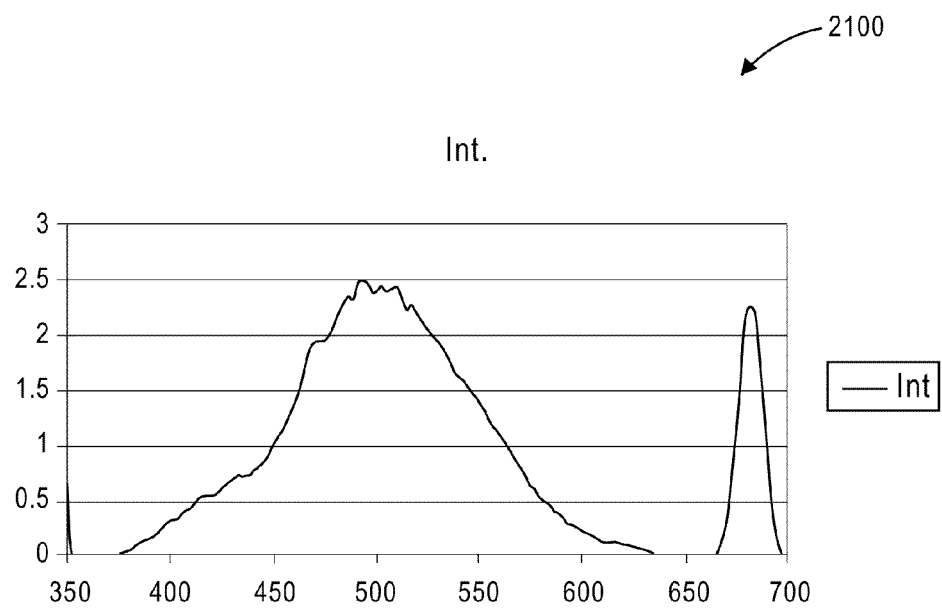
FIG. 21 is a fluorescence spectrum of silver gallium sulfide (AGS) nano-particles grown with a 1:4 Ag:Ga precursor ratio, in accordance with an embodiment of the present invention.

In an embodiment, 550 nanometer particles were grown in a 1:2 ratio of Ag:Ga, while particles having a 500 nanometer bandgap were grown using a 1:4 ratio. FIG. 20 is a fluorescence spectrum 2000 of silver gallium sulfide (AGS) nano-particles grown with a 1:2 Ag:Ga precursor ratio, in accordance with an embodiment of the present invention. The peak at 550 nm, far redder than the predicted 470 nm, suggests that the crystals have a stoichiometry other than $AgGaS_2$. By comparison, FIG. 21 is a fluorescence spectrum 2100 of silver gallium sulfide (AGS) nano-particles grown with a 1:4 Ag:Ga precursor ratio, in accordance with an embodiment of the present invention. The blue shifted peak at 500 nm suggests that the crystals have a stoichiometry approaching closer to the ideal $AgGaS_2$.

Thus, in an embodiment, the bandgap of AGS particles can be tuned by the Ag:Ga ratio. Accordingly, AGS particles can be used as emitters, allowing for fine color tuning between 475-575 nm. In one embodiment, in order to improve the emission of the AGS particles, ZnS is used as a shell material to rapidly protect the AGS surface. In one embodiment, the AGS particles are fabricated by batch processing. Other embodiments include microwave assisted synthesis or continuous flow synthesis.

Thus, nano-crystalline core and nano-crystalline shell pairings having group I-III-VI material nano-crystalline cores, and methods of fabricating nano-crystalline core and nano-crystalline shell pairings having group I-III-VI material nano-crystalline cores, have been disclosed.

What is claimed is:

1. A semiconductor structure, comprising:
    a nano-crystalline core comprising a group I-III-VI semiconductor material; and
    a nano-crystalline shell comprising a group I-III-VI semiconductor material at least partially surrounding the nano-crystalline core, wherein the nano-crystalline core/nano-crystalline shell pairing has a photoluminescence quantum yield (PLQY) of greater than 60%; and
    wherein the nano-crystalline core/nano-crystalline shell pairing is a pairing selected from the group consisting of copper indium sulfide (CIS)/silver gallium sulfide (AgGaS$_2$), copper indium selenide (CISe)/AgGaS$_2$, copper gallium selenide (CuGaSe$_2$)/copper gallium sulfide (CuGaS$_2$), and CuGaSe$_2$/AgGaS$_2$.

2. The semiconductor structure of claim 1, wherein the nano-crystalline core is an emitter having a direct, bulk band gap approximately in the range of 1-2.5 eV.

3. The semiconductor structure of claim 1, wherein the nano-crystalline core and nano-crystalline shell have a lattice mismatch of equal to or less than approximately 10%.

4. The semiconductor structure of claim 1, further comprising:
    a nano-crystalline outer shell comprising a third, different, semiconductor material at least partially surrounding the nano-crystalline shell.

5. The semiconductor structure of claim 4, wherein the third semiconductor material is zinc sulfide (ZnS).

6. The semiconductor structure of claim 1, further comprising:
    a compositional transition layer disposed between, and in contact with, the nano-crystalline core and nano-crystalline shell, the compositional transition layer having a composition intermediate to the nano-crystalline core semiconductor material and the nano-crystalline shell semiconductor material.

7. The semiconductor structure of claim 6, wherein the compositional transition layer is an alloyed layer comprising a mixture of the nano-crystalline core semiconductor material and the nano-crystalline shell semiconductor material.

8. The semiconductor structure of claim 6, wherein the compositional transition layer is a graded layer comprising a compositional gradient of the nano-crystalline core semiconductor material proximate to the nano-crystalline core through to the nano-crystalline shell semiconductor material proximate to the nano-crystalline shell.

9. The semiconductor structure of claim 1, wherein the nano-crystalline core is anisotropic nano-crystalline core having an aspect ratio between, but not including, 1.0 and 2.0.

10. The semiconductor structure of claim 9, wherein the nano-crystalline shell is an anisotropic nano-crystalline shell having an aspect ratio approximately in the range of 2-6.

11. The semiconductor structure of claim 1, further comprising:
    an insulator coating surrounding and encapsulating the nano-crystalline core/nano-crystalline shell pairing.

12. The semiconductor structure of claim 11, wherein the insulator coating comprises an amorphous material selected from the group consisting of silica (SiO$_x$), titanium oxide (TiO$_x$), zirconium oxide (ZrO$_x$), alumina (AlO$_x$), and hafnia (HfO$_x$).

13. The semiconductor structure of claim 1, wherein the nano-crystalline shell completely surrounds the nano-crystalline core.

14. The semiconductor structure of claim 1, wherein the nano-crystalline shell only partially surrounds the nano-crystalline core, exposing a portion of the nano-crystalline core.

15. The semiconductor structure of claim 1, wherein the nano-crystalline core is disposed in an asymmetric orientation with respect to the nano-crystalline shell.

16. The semiconductor structure of claim 1, wherein the nano-crystalline core and nano-crystalline shell form a quantum dot.

17. The semiconductor structure of claim 16, wherein the quantum dot is a down-converting quantum dot.

18. A semiconductor structure, comprising:
    a nano-crystalline core comprising a group I-III-VI semiconductor material; and
    a nano-crystalline shell comprising a group I-III-VI, semiconductor material at least partially surrounding the nano-crystalline core, wherein the nano-crystalline core/nano-crystalline shell pairing is a Type I heterostructure; and
    wherein the nano-crystalline core/nano-crystalline shell pairing is a pairing selected from the group consisting of copper indium sulfide (CIS)/silver gallium sulfide (AgGaS$_2$), copper indium selenide (CISe)/AgGaS$_2$, copper gallium selenide (CuGaSe$_2$)/copper gallium sulfide (CuGaS$_2$), and CuGaSe$_2$/AgGaS$_2$.

19. The semiconductor structure of claim 18, wherein the nano-crystalline core is an emitter having a direct, bulk band gap approximately in the range of 1-2.5 eV.

20. The semiconductor structure of claim 18, wherein the nano-crystalline core and nano-crystalline shell have a lattice mismatch of less than approximately 4%.

21. The semiconductor structure of claim 18, further comprising:
    a nano-crystalline outer shell comprising a third, different, semiconductor material at least partially surrounding the nano-crystalline shell.

22. The semiconductor structure of claim 21, wherein the third semiconductor material is zinc sulfide (ZnS).

23. The semiconductor structure of claim 18, further comprising:
a compositional transition layer disposed between, and in contact with, the nano-crystalline core and nano-crystalline shell, the compositional transition layer having a composition intermediate to the nano-crystalline core semiconductor material and the nano-crystalline shell semiconductor material.

24. The semiconductor structure of claim 23, wherein the compositional transition layer is an alloyed layer comprising a mixture of the nano-crystalline core semiconductor material and the nano-crystalline shell semiconductor material.

25. The semiconductor structure of claim 23, wherein the compositional transition layer is a graded layer comprising a compositional gradient of the nano-crystalline core semiconductor material proximate to the nano-crystalline core through to the nano-crystalline shell semiconductor material proximate to the nano-crystalline shell.

26. The semiconductor structure of claim 18, wherein the nano-crystalline core is anisotropic nano-crystalline core having an aspect ratio between, but not including, 1.0 and 2.0.

27. The semiconductor structure of claim 26, wherein the nano-crystalline shell is an anisotropic nano-crystalline shell having an aspect ratio approximately in the range of 2-6.

28. The semiconductor structure of claim 18, further comprising:
an insulator coating surrounding and encapsulating the nano-crystalline core/nano-crystalline shell pairing.

29. The semiconductor structure of claim 28, wherein the insulator coating comprises an amorphous material selected from the group consisting of silica ($SiO_x$), titanium oxide ($TiO_x$), zirconium oxide ($ZrO_x$), alumina ($AlO_x$), and hafnia ($HfO_x$).

30. The semiconductor structure of claim 18, wherein the nano-crystalline shell completely surrounds the nano-crystalline core.

31. The semiconductor structure of claim 18, wherein the nano-crystalline shell only partially surrounds the nano-crystalline core, exposing a portion of the nano-crystalline core.

32. The semiconductor structure of claim 18, wherein the nano-crystalline core is disposed in an asymmetric orientation with respect to the nano-crystalline shell.

33. The semiconductor structure of claim 18, wherein the nano-crystalline core and nano-crystalline shell form a quantum dot.

34. The semiconductor structure of claim 33, wherein the quantum dot is a down-converting quantum dot.

35. A composite, comprising:
a matrix material; and
a plurality of semiconductor structures embedded in the matrix material, each semiconductor structure comprising:
a nano-crystalline core comprising a group I-III-VI semiconductor material;
a nano-crystalline shell comprising a second, different, semiconductor material at least partially surrounding the nano-crystalline core, wherein the nano-crystalline core/nano-crystalline shell pairing has a photoluminescence quantum yield (PLQY) of greater than 60%; and
an amorphous insulator coating surrounding and encapsulating the nano-crystalline core/nano-crystalline shell pairing wherein one or more of the semiconductor structures further comprises a coupling agent covalently bonded to an outer surface of the amorphous insulator coating.

36. The composite of claim 35, wherein each of the plurality of semiconductor structures is cross-linked with, polarity bound by, or tethered to the matrix material.

37. The composite of claim 35, wherein each of the plurality of semiconductor structures is bound to the matrix material by a covalent, dative, or ionic bond.

38. The composite of claim 35, wherein, for each of the plurality of semiconductor structures, the second semiconductor material is a group I-III-VI material.

39. The composite of claim 38, wherein, for each of the plurality of semiconductor structures, the nano-crystalline core/nano-crystalline shell pairing is a pairing selected from the group consisting of copper indium sulfide (CIS)/silver gallium sulfide ($AgGaS_2$), copper indium selenide (CISe)/$AgGaS_2$, copper gallium selenide ($CuGaSe_2$)/copper gallium sulfide ($CuGaS_2$), and $CuGaSe_2$/$AgGaS_2$.

40. A composite, comprising:
a matrix material; and
a plurality of semiconductor structures embedded in the matrix material, each semiconductor structure comprising:
a nano-crystalline core comprising a group I-III-VI semiconductor material;
a nano-crystalline shell comprising a second, different, semiconductor material at least partially surrounding the nano-crystalline core, wherein the nano-crystalline core/nano-crystalline shell pairing is a Type I hetero-structure; and
an amorphous insulator coating surrounding and encapsulating the nano-crystalline core/nano-crystalline shell pairing wherein one or more of the semiconductor structures further comprises a coupling agent covalently bonded to an outer surface of the amorphous insulator coating.

41. The composite of claim 40, wherein each of the plurality of semiconductor structures is cross-linked with, polarity bound by, or tethered to the matrix material.

42. The composite of claim 40, wherein each of the plurality of semiconductor structures is bound to the matrix material by a covalent, dative, or ionic bond.

43. The composite of claim 40, wherein, for each of the plurality of semiconductor structures, the second semiconductor material is a group I-III-VI material.

44. The composite of claim 43, wherein, for each of the plurality of semiconductor structures, the nano-crystalline core/nano-crystalline shell pairing is a pairing selected from the group consisting of copper indium sulfide (CIS)/silver gallium sulfide ($AgGaS_2$), copper indium selenide (CISe)/$AgGaS_2$, copper gallium selenide ($CuGaSe_2$)/copper gallium sulfide ($CuGaS_2$), and $CuGaSe_2$/$AgGaS_2$.

* * * * *